(12) United States Patent
Tanaka et al.

(10) Patent No.: US 12,334,700 B2
(45) Date of Patent: Jun. 17, 2025

(54) WAVELENGTH CONVERSION APPARATUS, SOLID-STATE LASER SYSTEM, AND ELECTRONIC DEVICE MANUFACTURING METHOD

(71) Applicant: Gigaphoton Inc., Tochigi (JP)

(72) Inventors: Yohei Tanaka, Oyama (JP); Chen Qu, Oyama (JP); Atsushi Fuchimukai, Oyama (JP)

(73) Assignee: Gigaphoton Inc., Tochigi (JP)

(*) Notice: Subject to any disclaimer, the term of this patent is extended or adjusted under 35 U.S.C. 154(b) by 751 days.

(21) Appl. No.: 17/666,471

(22) Filed: Feb. 7, 2022

(65) Prior Publication Data
US 2022/0158402 A1 May 19, 2022

Related U.S. Application Data

(63) Continuation of application No. PCT/JP2019/036172, filed on Sep. 13, 2019.

(51) Int. Cl.
*H01S 3/00* (2006.01)
*G02F 1/35* (2006.01)
(Continued)

(52) U.S. Cl.
CPC .......... *H01S 3/0092* (2013.01); *G02F 1/3505* (2021.01); *G02F 1/3548* (2021.01);
(Continued)

(58) Field of Classification Search
CPC .............................. H01S 3/0092; G02F 1/3505
See application file for complete search history.

(56) References Cited

U.S. PATENT DOCUMENTS 6,002,697 A 12/1999 Govorkov et al.
8,298,335 B2 * 10/2012 Armstrong ............ G02F 1/3501
117/203

(Continued)

FOREIGN PATENT DOCUMENTS

CN 101620356 A 1/2010
EP 1312976 A1 5/2003
(Continued)

OTHER PUBLICATIONS

International Search Report issued in PCT/JP2019/036172; mailed Dec. 17, 2019.
(Continued)

*Primary Examiner* — Michael Carter
(74) *Attorney, Agent, or Firm* — Studebaker Brackett PLLC

(57) ABSTRACT

A wavelength conversion apparatus according to an aspect of the present disclosure is a wavelength conversion apparatus that performs wavelength conversion of light through a non-linear crystal and including a first non-linear crystal, a container in which the first non-linear crystal is housed, a crystal holding member provided inside the container for fixing the first non-linear crystal, a first window provided to the container for guiding light to the first non-linear crystal from outside of the container, a second window provided to the container for guiding light output from the first non-linear crystal to outside of the container, a first heater provided inside the container for heating the first non-linear crystal, a battery that supplies electric power to the first heater, and a first controller that controls electric power supply to the first heater.

25 Claims, 20 Drawing Sheets

(51) Int. Cl.
*G02F 1/37* (2006.01)
*H01S 3/109* (2006.01)
*G03F 7/00* (2006.01)
*H01S 3/225* (2006.01)

(52) U.S. Cl.
CPC ............... *G02F 1/37* (2013.01); *H01S 3/109* (2013.01); *G03F 7/70341* (2013.01); *H01S 3/2251* (2013.01)

(56) References Cited

U.S. PATENT DOCUMENTS

| | | | |
|---|---|---|---|
| 2004/0141534 A1 | 7/2004 | Hashimoto et al. | |
| 2005/0225837 A1* | 10/2005 | Kojima | G02F 1/3501 359/326 |
| 2008/0291528 A1* | 11/2008 | Susumu | G02F 1/3501 359/326 |
| 2009/0323172 A1* | 12/2009 | Furuya | G02F 1/3775 359/326 |
| 2015/0323743 A1* | 11/2015 | Nicholson | H04B 10/506 385/24 |
| 2019/0245321 A1* | 8/2019 | Kakizaki | H01S 3/2375 |

FOREIGN PATENT DOCUMENTS

| | | |
|---|---|---|
| JP | H07-120799 A | 5/1995 |
| JP | 2001-051311 A | 2/2001 |
| JP | 2001066654 A * | 3/2001 |
| JP | 2002-199600 A | 7/2002 |
| JP | 2003-156773 A | 5/2003 |
| JP | 2004-219878 A | 8/2004 |
| JP | 2010-033049 A | 2/2010 |
| WO | 02/48787 A1 | 6/2002 |
| WO | 2018/105082 A1 | 6/2018 |

OTHER PUBLICATIONS

International Preliminary Report on Patentability and Written Opinion issued in PCT/JP2019/036172; issued Mar. 15, 2022.

An Office Action issued by the Japanese Patent Office on Aug. 18, 2023, which corresponds to Japanese Patent Application No. 2021-545084 and is related to U.S. Appl. No. 17/666,471.

An Office Action mailed by China National Intellectual Property Administration on Feb. 14, 2025, which corresponds to Chinese Patent Application No. 201980098873.1 and is related to U.S. Appl. No. 17/666,471.

* cited by examiner

Fig. 5
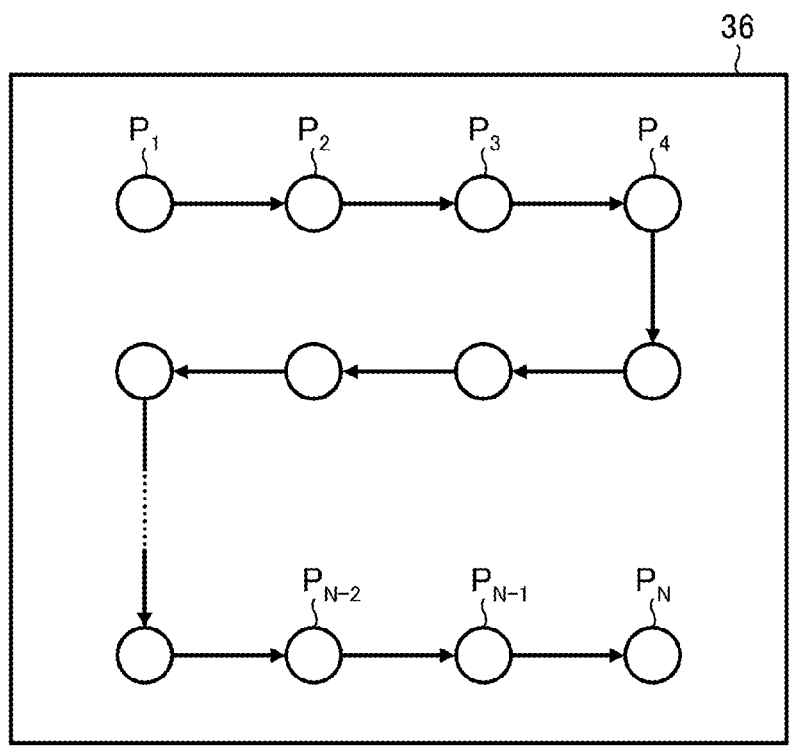
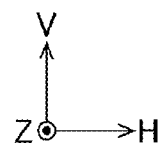

Fig. 16
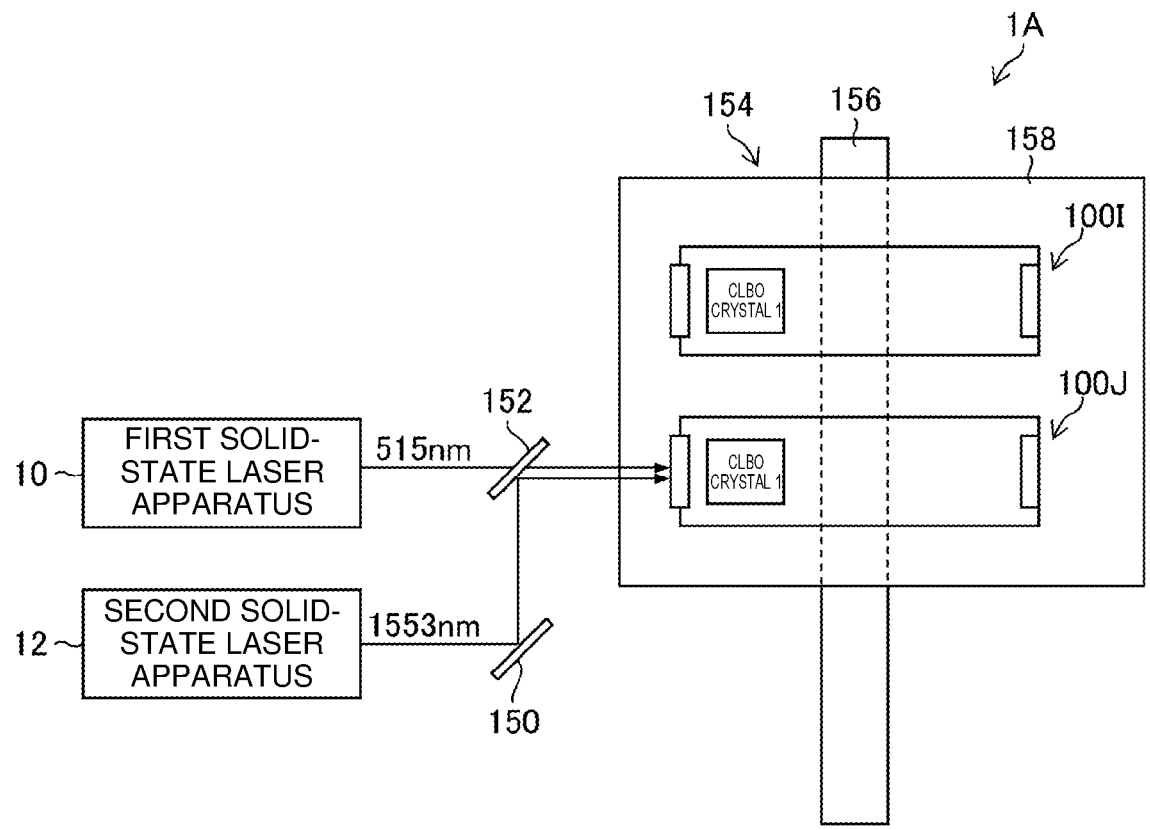
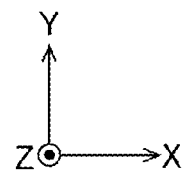

WAVELENGTH CONVERSION APPARATUS, SOLID-STATE LASER SYSTEM, AND ELECTRONIC DEVICE MANUFACTURING METHOD

CROSS-REFERENCE TO RELATED APPLICATIONS

The present application is a continuation application of International Application No. PCT/JP2019/036172, filed on Sep. 13, 2019, the entire contents of which are hereby incorporated by reference.

BACKGROUND

1. Technical Field

The present disclosure relates to a wavelength conversion apparatus, a solid-state laser system, and an electronic device manufacturing method.

2. Related Art

In a semiconductor exposure apparatus, resolving power improvement has been requested along with miniaturization and high integration of a semiconductor integrated circuit. Hereinafter, a semiconductor exposure apparatus is simply referred to as an "exposure apparatus". Thus, the wavelength of light emitted from an exposure light source has been shortened. A gas laser apparatus is used as the exposure light source in place of a conventional mercury lamp. Examples of the gas laser apparatus currently used for exposure include a KrF excimer laser apparatus configured to emit ultraviolet light having a wavelength of 248 nm, and an ArF excimer laser apparatus configured to emit ultraviolet light having a wavelength of 193 nm.

In immersion exposure, which is practically used as a current exposure technology, a gap between a projection lens on the exposure apparatus side and a wafer is filled with liquid to change the refractive index of the gap so that the apparent wavelength of the exposure light source is shortened. When the immersion exposure is performed by using the ArF excimer laser apparatus as the exposure light source, the wafer is irradiated with ultraviolet light having a wavelength of 134 nm in water. This technology is called ArF immersion exposure. The ArF immersion exposure is also called ArF immersion lithography.

The KrF and ArF excimer laser apparatuses each have a wide spectrum line width of 350 pm to 400 pm approximately in spontaneous oscillation, and accordingly, chromatic aberration occurs to a laser beam (ultraviolet light) subjected to reduced projection onto the wafer through the projection lens on the exposure apparatus side, which leads to resolving power decrease. Thus, the spectrum line width of a laser beam emitted from the gas laser apparatus needs to be narrowed so that chromatic aberration is negligible. The spectrum line width is also called spectrum width. To narrow the spectrum line width, a line narrowing module including a line narrowing element is provided in a laser resonator of the gas laser apparatus so that the spectrum width is narrowed by the line narrowing module. The line narrowing element may be, for example, an etalon or grating. A laser apparatus having a narrowed spectrum width in this manner is referred to as a line narrowing laser apparatus.

LIST OF DOCUMENTS

Patent Documents

Patent Document 1: US Published Patent Application No. 2008/0291528
Patent Document 2: Japanese Unexamined Patent Application Publication No. 2002-199600

SUMMARY

A wavelength conversion apparatus according to an aspect of the present disclosure is a wavelength conversion apparatus that performs wavelength conversion of light through a non-linear crystal. The wavelength conversion apparatus may include a first non-linear crystal, a container, a crystal holding member, a first window, a second window, a first heater, a battery, and a first controller. The container may be a container in which the first non-linear crystal is housed. The crystal holding member may be provided inside the container and fix the first non-linear crystal. The first window may be a window that is provided to the container and through which light is guided to the first non-linear crystal from outside of the container. The second window may be a window that is provided to the container and through which light output from the first non-linear crystal is guided to outside of the container. The first heater may be provided inside the container and configured to heat the first non-linear crystal. The battery may be configured to supply electric power to the first heater. The first controller may be configured to control electric power supply to the first heater.

A solid-state laser system according to another aspect of the present disclosure may include a solid-state laser apparatus and a first wavelength conversion apparatus. The solid-state laser apparatus may be configured to emit light. The first wavelength conversion apparatus may be configured to perform wavelength conversion of light through a non-linear crystal. The first wavelength conversion apparatus may include a first non-linear crystal, a container, a crystal holding member, a first window, a second window, a first heater, a battery, and a first controller. The container may be a container in which the first non-linear crystal is housed. The crystal holding member may be provided inside the container and fix the first non-linear crystal. The first window may be a window that is provided to the container and through which light is guided to the first non-linear crystal from outside of the container. The second window may be a window that is provided to the container and through which light output from the first non-linear crystal is guided to outside of the container. The first heater may be provided inside the container and configured to heat the first non-linear crystal. The battery may be configured to supply electric power to the first heater. The first controller may be configured to control electric power supply to the first heater.

An electronic device manufacturing method according to another aspect of the present disclosure may include generating an excimer laser beam by a laser system, emitting the excimer laser beam to an exposure apparatus, and exposing a photosensitive substrate to the excimer laser beam in the exposure apparatus to manufacture an electronic device. The laser system may include a solid-state laser system and an excimer amplifier. The solid-state laser system may include a solid-state laser apparatus and a wavelength conversion apparatus. The solid-state laser apparatus may be configured to emit light. The wavelength conversion apparatus may be configured to perform wavelength conversion of light through a non-linear crystal. The wavelength conversion apparatus may include a first non-linear crystal, a container, a crystal holding member, a first window, a second window, a first heater, a battery, and a first controller. The container may be a container in which the first non-linear crystal is housed. The crystal holding member may be provided inside the container and fix the first non-linear crystal. The first window may be a window that is provided to the container and through which light is guided to the first non-linear crystal from outside of the container. The second window may be a window that is provided to the container and through which light output from the first non-linear crystal is guided to outside of the container. The first heater may be provided inside the container and configured to heat the first non-linear crystal. The battery may be configured to supply electric power to the first heater. The first controller may be configured to control electric power supply to the first heater. The excimer amplifier may amplify a laser beam output through the second window.

BRIEF DESCRIPTION OF THE DRAWINGS

Embodiments of the present disclosure will be described below by way of example only with reference to the accompanying drawings.

FIG. 5 is a diagram illustrating a laser beam incident surface of a second CLBO crystal.

FIG. 16 is a diagram illustrating a state in which a placement table is moved from a state illustrated in FIG. 15.

DESCRIPTION OF EMBODIMENTS

Figure 1:
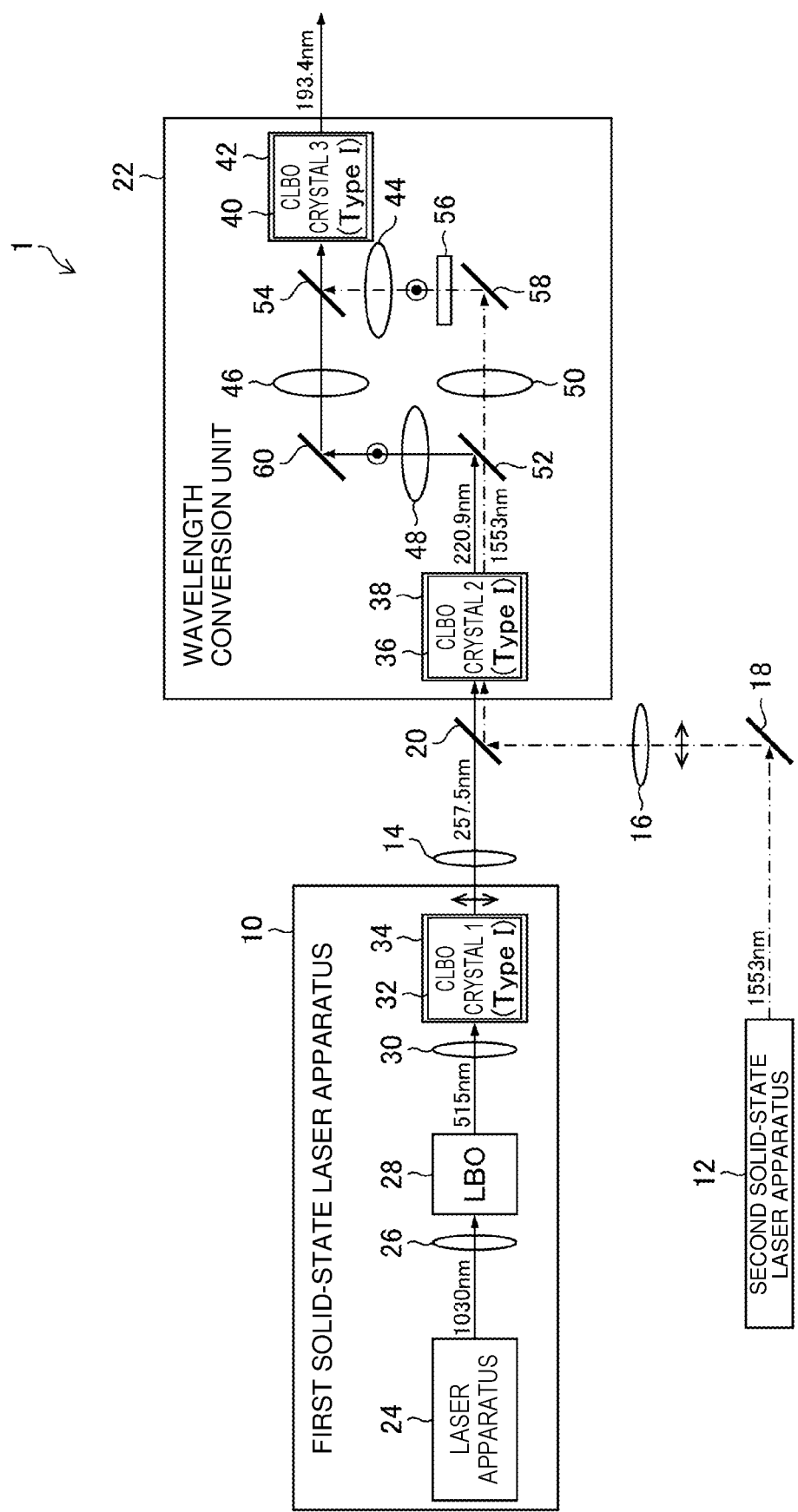
FIG. 1 is a diagram schematically illustrating the configuration of a solid-state laser system.

<Contents>
1. Terms
2. Overview of solid-state laser system
2.1 Configuration
2.1.1 Configuration of solid-state laser system
2.1.2 Internal configuration of CLBO crystal cell
2.2 Operation
2.3 Replacement of CLBO crystal cell
3. Problem
4. Embodiment 1
4.1 Configuration
4.2 Operation
4.2.1 Replacement processing of drive cell with backup cell
4.2.2 Determination of timing of preparation for drive cell crystal replacement
4.3 Effect
5. Embodiment 2
5.1 Configuration
5.2 Operation
5.3 Effect
6. Embodiment 3
6.1 Configuration
6.2 Operation
6.3 Effect
6.4 Modifications
7. Embodiment 4
7.1 Configuration
7.2 Operation
7.2.1 Automatic purge operation and purge gas switching operation
7.3 Effect
8. Embodiment 5
8.1 Configuration
8.2 Operation
8.2.1 Temperature control mode switching
8.3 Effect
9. Embodiment 6
9.1 Configuration
9.2 Operation
9.3 Effect
10. Embodiment 7
10.1 Configuration
10.2 Operation
10.3 Effect
11. Embodiment 8
11.1 Configuration
11.2 Operation
11.3 Effect
12. Embodiment 9
12.1 Configuration
12.2 Operation
12.3 Effect
13. Electronic device manufacturing method 14. Other Embodiments of the present disclosure will be described below in detail with reference to the accompanying drawings. The embodiments described below are examples of the present disclosure and do not limit the contents of the present disclosure. Not all configurations and operations described in each embodiment are necessarily essential as configurations and operations of the present disclosure. Components identical to each other are denoted by the same reference sign, and duplicate description thereof will be omitted.

1. Terms

Terms used in the present specification are defined as described below.

A "hybrid laser apparatus" means a two-stage laser apparatus including an oscillation stage (master oscillator) and an amplification stage (amplification device), the apparatus including a solid-state laser apparatus at the oscillation stage and an excimer laser apparatus at the amplification stage. An "excimer amplifier" means the excimer laser apparatus used at the amplification stage.

The term "parallel" in the present specification may include the concept of being substantially parallel, which can be regarded as a range substantially equivalent to parallel in technical sense. The term "perpendicular" or "orthogonal" in the present specification may include the concept of being substantially perpendicular or substantially orthogonal, which can be regarded as a range substantially perpendicular or substantially orthogonal in technical significance.

2. Overview of Solid-State Laser System 2.1 Configuration 2.1.1 Configuration of Solid-State Laser System FIG. 1 is a diagram schematically illustrating the configuration of a solid-state laser system 1. As illustrated in FIG. 1, the solid-state laser system 1 includes a first solid-state laser apparatus 10, a second solid-state laser apparatus 12, a third light condensing lens 14, a fourth light condensing lens 16, a first high reflective mirror 18, a first dichroic mirror 20, and a wavelength conversion unit 22.

The first solid-state laser apparatus 10 includes a laser apparatus 24 configured to emit a pulse laser beam having a wavelength of 1030 nm, a first light condensing lens 26, an LBO ($LiB_3O_5$) crystal 28, a second light condensing lens 30, and a first CLBO ($CsLiB_6O_{10}$) crystal 32.

The LBO crystal 28 is a non-linear crystal. The first CLBO crystal 32 is a wavelength conversion crystal having a phase matching condition of type 1. The first CLBO crystal 32 is disposed in a first CLBO crystal cell 34.

The second solid-state laser apparatus 12 is a laser apparatus configured to emit a pulse laser beam having a wavelength of 1553 nm.

The first high reflective mirror 18 and the first dichroic mirror 20 are disposed so that pulse laser beam emitted from the second solid-state laser apparatus 12 and having a wavelength of 1553 nm is input to the wavelength conversion unit 22. The third light condensing lens 14 is disposed on an optical path between the first CLBO crystal 32 of the first solid-state laser apparatus 10 and the first dichroic mirror 20. The fourth light condensing lens 16 is disposed on an optical path between the first high reflective mirror 18 and the first dichroic mirror 20.

The first dichroic mirror 20 is coated with a film that highly transmits a pulse laser beam emitted from the first solid-state laser apparatus 10 and having a wavelength of 257.5 nm and highly reflects a pulse laser beam emitted from the second solid-state laser apparatus 12 and having a wavelength of 1553 nm. The first dichroic mirror 20 is disposed so that the pulse laser beams emitted from the first solid-state laser apparatus 10 and the second solid-state laser apparatus 12 are incident on the wavelength conversion unit 22 with their optical axes aligned with each other.

The wavelength conversion unit 22 includes a second CLBO crystal 36 and a third CLBO crystal 40 as wavelength conversion elements. The wavelength conversion unit 22 also includes a fifth light condensing lens 44, a sixth light condensing lens 46, a first collimator lens 48, a second collimator lens 50, a second dichroic mirror 52, a third dichroic mirror 54, a half-wavelength plate 56, a second high reflective mirror 58, and a third high reflective mirror 60.

The second CLBO crystal 36 and the third CLBO crystal 40 are each a wavelength conversion crystal having a phase matching condition of type 1. The second CLBO crystal 36 is disposed in a second CLBO crystal cell 38. The third CLBO crystal 40 is disposed in a third CLBO crystal cell 42.

The second dichroic mirror 52, the second collimator lens 50, the second high reflective mirror 58, the half-wavelength plate 56, the fifth light condensing lens 44, and the third dichroic mirror 54 are disposed in the stated order on the optical path of a pulse laser beam output from the second CLBO crystal 36 and having a wavelength of 1553 nm. The second dichroic mirror 52, the first collimator lens 48, the third high reflective mirror 60, the sixth light condensing lens 46, and the third dichroic mirror 54 are disposed in the stated order on the optical path of a pulse laser beam output from the second CLBO crystal 36 and having a wavelength of 220.9 nm.

The second dichroic mirror 52 is coated with a film that highly transmits a pulse laser beam having a wavelength of 257.5 nm and a pulse laser beam having a wavelength of 1553 nm and highly reflects a pulse laser beam having a wavelength of 220.9 nm.

The third dichroic mirror 54 is coated with a film that highly transmits a pulse laser beam having a wavelength of 220.9 nm and highly reflects a pulse laser beam having a wavelength of 1553 nm.

The half-wavelength plate 56 rotates the polarization direction of a pulse laser beam transmitting therethrough by 90°.

The first high reflective mirror 18, the second high reflective mirror 58, and the third high reflective mirror 60 are each coated with a high reflective film corresponding to a wavelength to be reflected.

2.1.2 Internal Configuration of CLBO Crystal Cell

Figure 2:
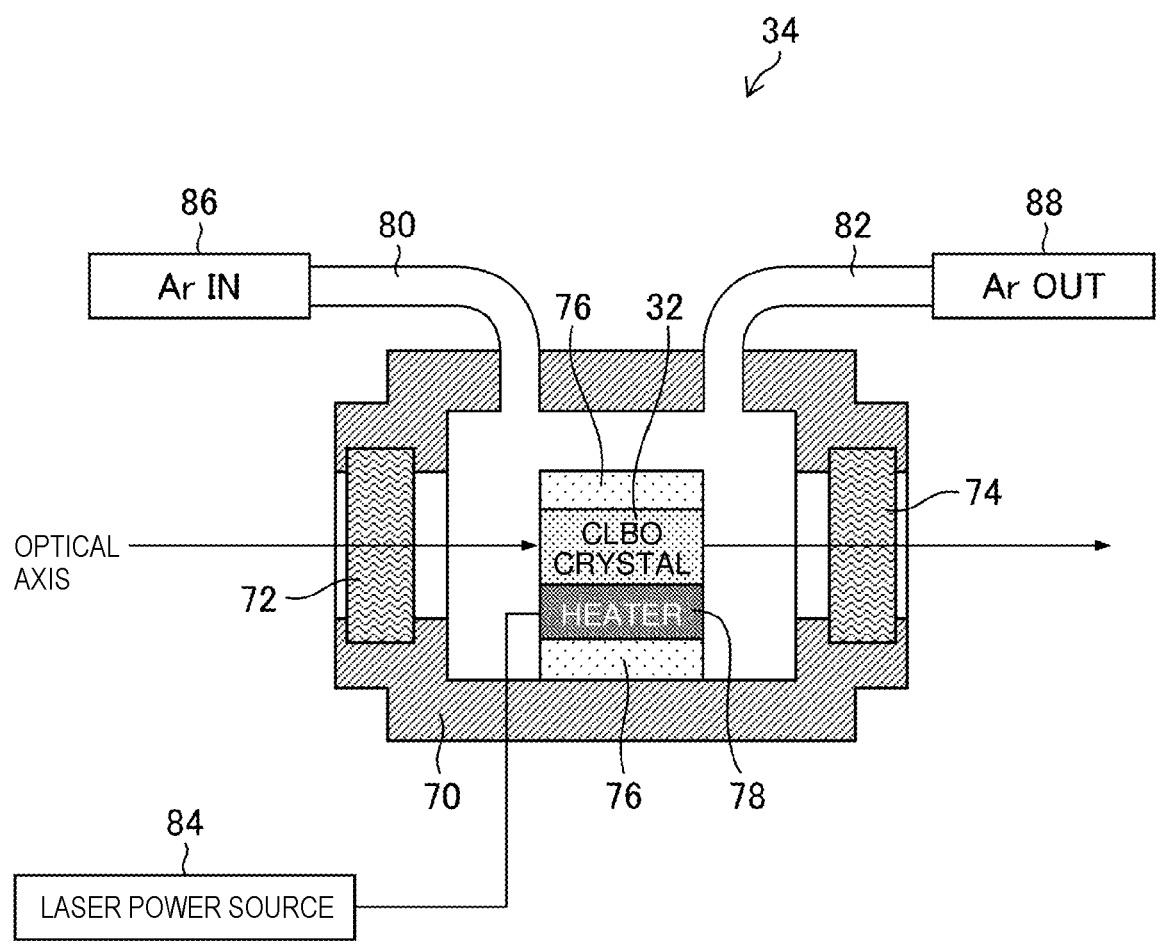
FIG. 2 is a diagram illustrating an internal structure of a first CLBO crystal cell.

FIG. 2 is a diagram illustrating an internal structure of the first CLBO crystal cell 34. As illustrated in FIG. 2, the first CLBO crystal cell 34 includes a first container 70, a first entrance window 72, a first exit window 74, a crystal holder 76, a first heater 78, an Ar gas supply pipe 80, and an Ar gas discharge pipe 82 in addition to the first CLBO crystal 32 described above.

The first entrance window 72, the first CLBO crystal 32, and the first exit window 74 are disposed on an optical axis inside the first container 70. The first entrance window 72 is an example of a "first window" in the present disclosure. The first exit window 74 is an example of a "second window" in the present disclosure.

The crystal holder 76 is a crystal holding member for fixing the first CLBO crystal 32. The first heater 78 is laid on the crystal holder 76. The first heater 78 is connected to a laser power source 84 that is a power source of the solid-state laser system 1.

The Ar gas supply pipe 80 connects an Ar gas supply apparatus 86 and the inside of the first container 70. The Ar gas discharge pipe 82 connects an Ar gas discharge apparatus 88 and the inside of the first container 70.

The first CLBO crystal cell 34, the second CLBO crystal cell 38, and the third CLBO crystal cell 42 have a common internal configuration, and thus description of the internal configurations of the second CLBO crystal cell 38 and the third CLBO crystal cell 42 is omitted. The Ar gas supply apparatus 86 and the Ar gas discharge apparatus 88 may be used in common.

2.2 Operation

Operation of the solid-state laser system 1 will be described below. In FIG. 1, a circle having a point at the center and provided on an optical path represents a polarization direction perpendicular to the sheet, and a double-headed arrow represents a polarization direction parallel to the sheet.

Ar gas is supplied into the first container 70 of each of the first CLBO crystal cell 34, the second CLBO crystal cell 38, and the third CLBO crystal cell 42 through the Ar gas supply pipe 80 in advance, and Ar gas is discharged through the Ar gas discharge pipe 82. In addition, electric power is supplied to the first heater 78 of each of the first CLBO crystal cell 34, the second CLBO crystal cell 38, and the third CLBO crystal cell 42 in advance, and the first CLBO crystal 32, the second CLBO crystal 36, and the third CLBO crystal 40 are maintained at the temperature of 120° C. by the first heater 78.

A pulse laser beam emitted from the laser apparatus 24 and having a wavelength of 1030 nm is converted into a pulse laser beam having a wavelength of 515 nm at the LBO crystal 28. The pulse laser beam having a wavelength of 515 nm is output from the LBO crystal 28 and incident on the first CLBO crystal 32.

The incident angle on the first CLBO crystal 32 is adjusted so that the pulse laser beam having a wavelength of 515 nm satisfies the phase matching condition. As a result, a pulse laser beam having a wavelength of 257.5 nm corresponding to the second harmonic of the pulse laser beam having a wavelength of 515 nm is generated at the first CLBO crystal 32.

The pulse laser beam emitted from the first solid-state laser apparatus 10 and having a wavelength of 257.5 nm and the pulse laser beam emitted from the second solid-state laser apparatus 12 and having a wavelength of 1553 nm are substantially simultaneously incident on the second CLBO crystal 36 with substantially identical optical axes by the first dichroic mirror 20.

The polarization directions of the pulse laser beam having a wavelength of 257.5 nm and the pulse laser beam having a wavelength of 1553 nm, both incident on the second CLBO crystal 36, are parallel to each other. The second CLBO crystal 36, which is of type 1, has a phase matching condition for pulse laser beams having polarization directions parallel to each other. Thus, the incident angle on the second CLBO crystal 36 is adjusted so that the pulse laser beam having a wavelength of 257.5 nm and the pulse laser beam having a wavelength of 1553 nm satisfy the phase matching condition, thereby generating a pulse laser beam having a wavelength of 220.9 nm, which is the sum frequency of the pulse laser beam having a wavelength of 257.5 nm and the pulse laser beam having a wavelength of 1553 nm. As a result, the second CLBO crystal 36 outputs the pulse laser beam having a wavelength of 220.9 nm, the pulse laser beam having a wavelength of 257.5 nm, and the pulse laser beam having a wavelength of 1553 nm.

The second dichroic mirror 52 reflects the pulse laser beam having a wavelength of 220.9 nm and transmits the pulse laser beam having a wavelength of 1553 nm and the pulse laser beam having a wavelength of 257.5 nm.

The polarization direction of the pulse laser beam having a wavelength of 1553 nm is rotated by 90° as the pulse laser beam transmits through the half-wavelength plate 56. As a result, the polarization directions of the pulse laser beam having a wavelength of 220.9 nm and the pulse laser beam having a wavelength of 1553 nm become parallel to each other.

The third dichroic mirror 54 reflects the pulse laser beam having a wavelength of 1553 nm and transmits the pulse laser beam having a wavelength of 220.9 nm and the pulse laser beam having a wavelength of 257.5 nm. In addition, the pulse laser beam having a wavelength of 220.9 nm is incident on the third CLBO crystal 40 with its optical axis substantially aligned with the optical axis of the pulse laser beam having a wavelength of 1553 nm and having the rotated polarization direction.

The polarization directions of the pulse laser beam having a wavelength of 220.9 nm and the pulse laser beam having a wavelength of 1553 nm, both incident on the third CLBO crystal 40 are parallel to each other. The third CLBO crystal 40, which is of type 1, has a phase matching condition for pulse laser beams having polarization directions parallel to each other. Thus, the incident angle on the third CLBO crystal 40 is adjusted so that the pulse laser beam having a wavelength of 220.9 nm and the pulse laser beam having a wavelength of 1553 nm satisfy the phase matching condition, thereby generating a pulse laser beam having a wavelength of 193.4 nm, which is the sum frequency of the pulse laser beam having a wavelength of 220.9 nm and the pulse laser beam having a wavelength of 1553 nm.

2.3 Replacement of CLBO Crystal Cell

Replacement of a CLBO crystal cell will be described below. The description will be made on replacement of the first CLBO crystal cell 34 as an example.

First, operation of the solid-state laser system 1 is stopped, and Ar gas supply and discharge at the first container 70 and electric power supply to the first heater 78 are stopped in the first CLBO crystal cell 34 having reached a replacement timing.

Subsequently, a user replaces the first CLBO crystal cell 34 having reached a replacement timing with a new first CLBO crystal cell 34. Right after the replacement, the solid-state laser system 1 resumes Ar gas supply and discharge at the first container 70 and electric power supply to the first heater 78 in the new first CLBO crystal cell 34. The first heater 78 heats the first CLBO crystal 32 to 120° C. The solid-state laser system 1 is left to stand for one to two days while Ar gas circulation into the new first CLBO crystal cell 34 is maintained and the temperature of the first CLBO crystal 32 is maintained at 120° C. Accordingly, the first CLBO crystal 32 of the new first CLBO crystal cell 34 is dehydrated.

When the dehydration of the first CLBO crystal 32 is completed, the solid-state laser system 1 resumes operation while maintaining Ar gas supply and discharge at the first container 70 and electric power supply to the first heater 78 in the new first CLBO crystal cell 34.

3. Problem

A CLBO crystal has moisture absorbency, and thus the CLBO crystal is heated to 120° C. approximately inside a container of a CLBO crystal cell as described above and used while the temperature thereof is maintained. When the lifetime of the CLBO crystal is reached, the CLBO crystal cell is opened to replace the CLBO crystal inside. After the replacement, one to two days are needed for heating, temperature rising, and dehydration of the CLBO crystal, which has resulted in a long maintenance time.

4. Embodiment 1

4.1 Configuration

Figure 3:
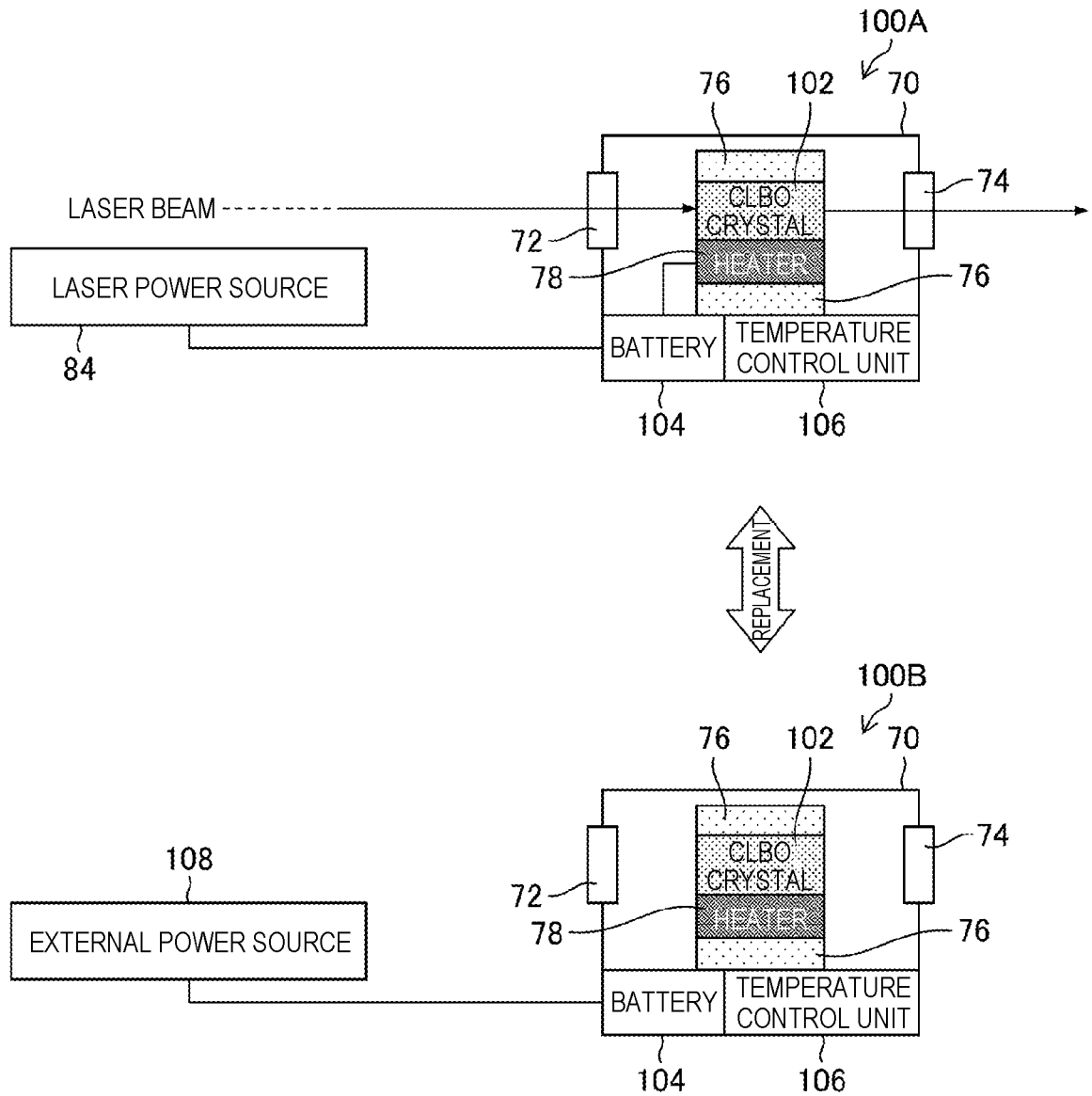
FIG. 3 is a diagram schematically illustrating the configuration of a first drive cell and a first backup cell according to Embodiment 1.

FIG. 3 is a diagram schematically illustrating the configuration of a first drive cell 100A and a first backup cell 100B as CLBO crystal cells according to Embodiment 1. The first drive cell 100A and the first backup cell 100B are each an example of a "wavelength conversion apparatus" in the present disclosure. Difference from the first CLBO crystal cell 34 illustrated in FIG. 2 will be described below.

The first drive cell 100A and the first backup cell 100B are CLBO crystal cells having identical configurations. The first drive cell 100A is a CLBO crystal cell in wavelength conversion operation in the solid-state laser system 1. The first drive cell 100A may be any of the first CLBO crystal cell 34, the second CLBO crystal cell 38, and the third CLBO crystal cell 42 illustrated in FIG. 1. The first backup cell 100B is a CLBO crystal cell in standby for replacement.

The first drive cell 100A and the first backup cell 100B each include a fourth CLBO crystal 102. The fourth CLBO crystal 102 of the first drive cell 100A and the fourth CLBO crystal 102 of the first backup cell 100B are non-linear crystals having the same phase matching condition. Although the CLBO crystals are described as examples, the first drive cell 100A and the first backup cell 100B may include β-BaB$_2$O$_4$ (BBO) crystals or LBO crystals having the same phase matching condition.

Furthermore, the first drive cell 100A and the first backup cell 100B each include a battery 104 and a temperature control unit 106. The battery 104 is an example of a "battery" in the present disclosure. The battery 104 is a primary battery, a secondary battery, or a capacitor that supplies electric power to the first heater 78 and the temperature control unit 106. The secondary battery may be, for example, a lithium-ion secondary battery or a lead secondary battery. When the battery 104 is a secondary battery or a capacitor, the battery 104 is connected to the laser power source 84 or an external power source 108 and charged.

The temperature control unit 106 is a controller configured to control electric power supply to the first heater 78. The temperature control unit 106 selects and switches whether electric power to the first heater 78 is supplied from the laser power source 84 or the external power source 108 or supplied from the battery 104. The battery 104 and the temperature control unit 106 are each integrated with the first container 70. The laser power source 84 and the external power source 108 are each an example of an "external power source" in the present disclosure. The external power source 108 may be a large-capacity battery.

4.2 Operation

Operation of the first drive cell 100A and the first backup cell 100B will be described below.

While mounted on the solid-state laser system 1, the first drive cell 100A is supplied with electric power from the laser power source 84 to control the temperature of the fourth CLBO crystal 102. The first entrance window 72 of the first drive cell 100A guides a pulse laser beam from the outside of the first container 70 to the fourth CLBO crystal 102. The fourth CLBO crystal 102 converts the wavelength of the incident pulse laser beam. The first exit window 74 guides the pulse laser beam having the converted wavelength, which is light from the fourth CLBO crystal 102, to the outside of the first container 70.

While not mounted on the solid-state laser system 1, the first backup cell 100B is supplied with electric power from the battery 104 to control the temperature of the fourth CLBO crystal 102. The first backup cell 100B may be supplied with electric power from the external power source 108 while not mounted on the solid-state laser system 1.

When the first drive cell 100A has reached a replacement timing, the user removes the first drive cell 100A from the solid-state laser system 1, and instead, attaches the first backup cell 100B to the solid-state laser system 1.

4.2.1 Replacement Processing of Drive Cell with Backup Cell

Figure 4:
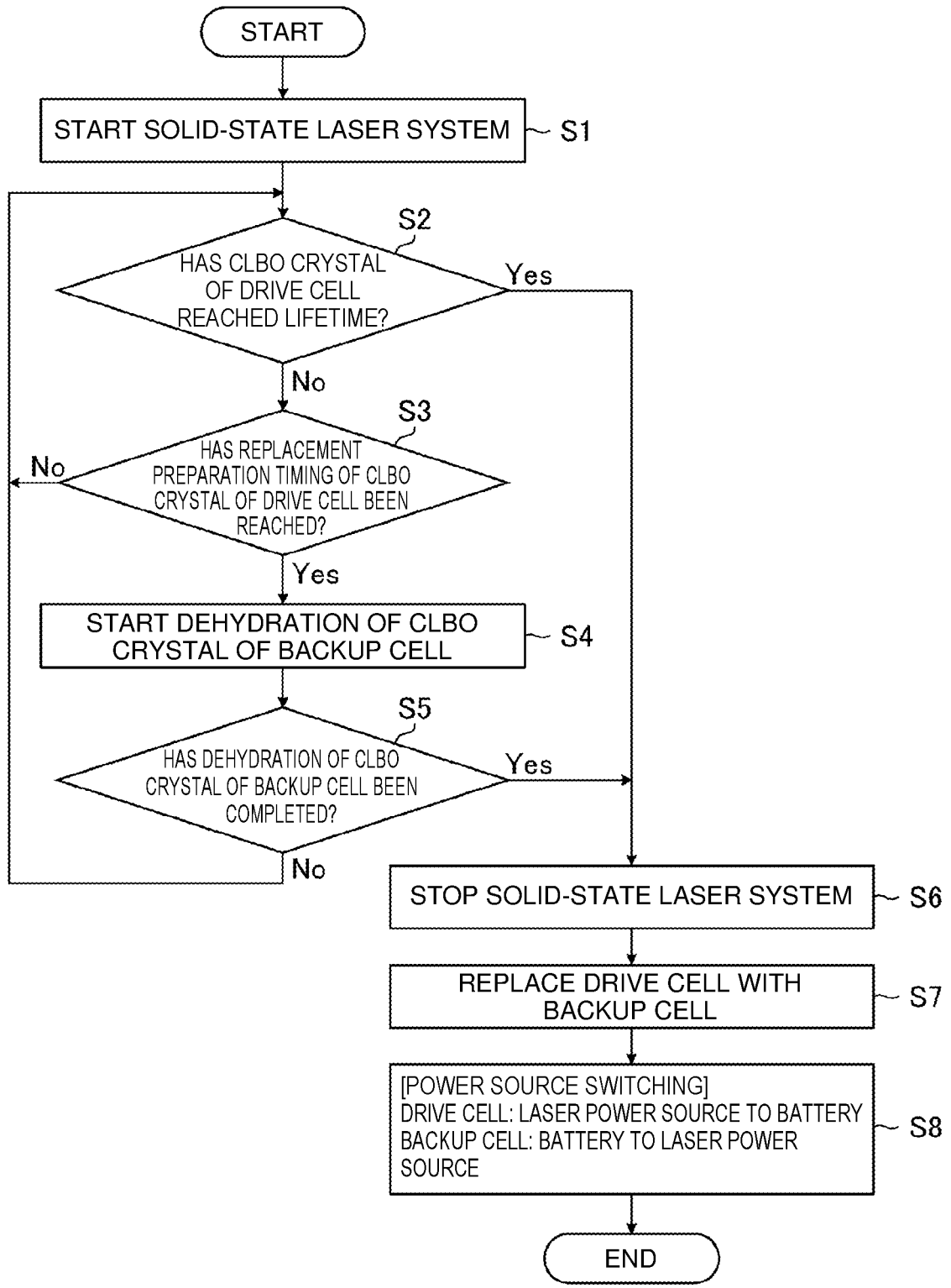
FIG. 4 is a flowchart illustrating replacement processing of the first drive cell with the first backup cell.

FIG. 4 is a flowchart illustrating replacement processing of the first drive cell 100A with the first backup cell 100B. In this example, the first drive cell 100A mounted on the solid-state laser system 1 is replaced with the first backup cell 100B. A "user" in the following description does not necessarily means one person but may be different persons as appropriate.

At step S1, the solid-state laser system 1 is started.

At step S2, the solid-state laser system 1 determines whether the fourth CLBO crystal 102 of the first drive cell 100A has reached its lifetime. The lifetime determination is performed by, for example, comparing the drive duration of the first drive cell 100A with a lifetime drive duration defined in advance. When the fourth CLBO crystal 102 has not reached its lifetime, the solid-state laser system 1 performs processing at step S3. When the fourth CLBO crystal 102 has reached its lifetime, the solid-state laser system 1 performs processing at step S6.

At step S3, the solid-state laser system 1 determines whether a replacement preparation timing of the fourth CLBO crystal 102 of the first drive cell 100A has been reached. The replacement preparation timing determination is performed by, for example, comparing the drive duration of the first drive cell 100A with a drive duration threshold value defined in advance. When the replacement preparation timing of the fourth CLBO crystal 102 has not been reached, the solid-state laser system 1 performs processing at step S2. When the replacement preparation timing of the fourth CLBO crystal 102 has been reached, the solid-state laser system 1 performs processing at step S4.

At step S4, the solid-state laser system 1 starts dehydration by heating the fourth CLBO crystal 102 of the first backup cell 100B. The heating of the fourth CLBO crystal 102 of the first backup cell 100B is performed by the first heater 78 of the first backup cell 100B. The temperature of the first heater 78 is managed by the temperature control unit 106. The temperature control unit 106 starts heating of the fourth CLBO crystal 102 based on a signal from the solid-state laser system 1. Dehydration is started when the fourth CLBO crystal 102 has reached a predetermined temperature. The signal from the solid-state laser system 1 is an example of a "signal from outside" in the present disclosure. The first backup cell 100B is supplied with electric power from the battery 104.

At step S5, the solid-state laser system 1 determines whether the dehydration of the fourth CLBO crystal 102 of the first backup cell 100B has been completed. The dehydration completion determination is performed by, for example, comparing an elapsed time since the start of heating of the first backup cell 100B with a threshold value of a time taken for dehydration, which is defined in advance. When the dehydration of the fourth CLBO crystal 102 has not been completed, the solid-state laser system 1 performs processing at step S2. When the dehydration of the fourth CLBO crystal 102 has been completed, the solid-state laser system 1 performs processing at step S6.

At step S6, operation of the solid-state laser system 1 is stopped. Subsequently at step S7, the user replaces the first drive cell 100A with the first backup cell 100B by removing the first drive cell 100A from the solid-state laser system 1 and attaching the first backup cell 100B to the solid-state laser system 1.

At step S8, the power sources of the first drive cell 100A and the first backup cell 100B are each switched along with the replacement of the first drive cell 100A with the first backup cell 100B at step S7. Specifically, the source of electric power supply to the first drive cell 100A is switched from the laser power source 84 to the battery 104 of the first drive cell 100A. In addition, the source of electric power supply to the first backup cell 100B is switched from the battery 104 of the first backup cell 100B to the laser power source 84.

Accordingly, the replacement of the first drive cell 100A with the first backup cell 100B ends.

4.2.2 Determination of Timing of Preparation for Drive Cell Crystal Replacement The determination of whether the replacement preparation timing of the fourth CLBO crystal 102 of the first drive cell 100A has been reached at step S3 will be described below in detail. The solid-state laser system 1 performs the determination based on at least one of (1) to (6) below.

(1) Detection Based on Laser Irradiation Time

A total laser irradiation time in which the fourth CLBO crystal 102 is irradiated with a laser beam is measured from the start of use of the first drive cell 100A, and a timing at which a defined time is reached is detected. For example, the total laser irradiation time of a CLBO crystal has a threshold at 4000 hours, and the defined time is 3200 hours, which is 80% of 4000 hours.

(2) Detection Based on the Number of Pulses

The number of pulses with which the fourth CLBO crystal 102 is irradiated with a laser beam is counted from the start of use of the first drive cell 100A, and a timing at which a defined number is reached is detected. For example, the total number of pulses of a CLBO crystal has a threshold at 20 billion ($20 \times 10^9$), and the defined number is 16 billion, which is 80% of 20 billion.

(3) Detection Based on Laser Output after Wavelength Conversion

A non-illustrated first energy sensor is provided downstream of the wavelength conversion unit 22, and a timing at which the pulse energy of wavelength-converted light becomes equal to or smaller than a threshold value is detected. The threshold value is, for example, 80 nW.

(4) Detection Based on Conversion Efficiency at Wavelength Conversion

A non-illustrated first energy sensor is provided downstream of the wavelength conversion unit 22, and a non-illustrated second energy sensor is provided upstream thereof. When $E_{out}$ represents an output from the first energy sensor and $E_{in}$ represents an output from the second energy sensor, and a timing at which a conversion efficiency $E_{out}/E_{in}$ at wavelength conversion becomes equal to or smaller than a threshold value is detected. For example, the threshold value is 1% when $E_{out}$ is an output from the third CLBO crystal 40 and Ein is an input to the second CLBO crystal 36.

(5) Detection Based on the Number of Times of Incident Point Movement

In a CLBO crystal, partial contamination occurs at a laser-beam incident point on an incident surface on which a laser beam is incident. Thus, when the contamination has advanced to some extent, the crystal is moved by a two-axial stage to move the incident point.

FIG. 5 is a diagram illustrating the laser beam incident surface of the second CLBO crystal 36. In FIG. 5, a Z direction is defined to be the traveling direction of a laser beam, a V direction is defined to be a direction orthogonal to the Z direction, and an H direction is defined to be a direction orthogonal to the V direction and the Z direction. First, the second CLBO crystal 36 is used while the laser beam is incident at point $P_1$. Thereafter, when contamination has advanced at point $P_1$, the second CLBO crystal 36 is moved in the H direction by a non-illustrated HVθ stage and used while the laser beam is incident at point $P_2$. Each time contamination advances at an incident point, the second CLBO crystal 36 is moved in the H direction or the V direction to switch the incident point to points $P_3, P_4, \ldots, P_{N-1}$, and $P_N$.

A timing at which the number of times of the incident point movement reaches a defined number is detected. When N represents the total number of incident points, the number of times of the movement is (N−1) in total, and the defined number is, for example, (N−2).

Although the above description is made on the incident point movement on the second CLBO crystal 36, the same description applies to the first CLBO crystal 32 and the third CLBO crystal 40.

(6) Detection Based on Laser Output Before Wavelength Conversion

A non-illustrated first energy sensor is provided downstream of the wavelength conversion unit 22, and a non-illustrated second energy sensor is provided upstream thereof. When energy before wavelength conversion is controlled so that energy after wavelength conversion is maintained constant, energy before wavelength conversion increases as a CLBO crystal degrades. Thus, a timing at which energy before wavelength conversion becomes equal to or higher than a threshold value is detected. The threshold value is, for example, 8 W for energy of a pulse laser beam having a wavelength of 257.5 nm and input to the wavelength conversion unit 22.

4.3 Effect

The fourth CLBO crystal 102 of the first drive cell 100A and the fourth CLBO crystal 102 of the first backup cell 100B according to Embodiment 1 are each heated by the first heater 78. The power of the first heater 78 is managed by the temperature control unit 106. The first heater 78 is connected to the battery 104, and the battery 104 can be connected to and disconnected from the laser power source 84 as an existing power source of the solid-state laser system 1 and the external power source 108.

Thus, when not connected to the laser power source 84 nor the external power source 108, the first backup cell 100B can still maintain the fourth CLBO crystal 102 in a dehydrated state in advance by using the battery 104. Accordingly, it is possible to reduce the time of maintenance for replacing the first drive cell 100A with the first backup cell 100B.

Moreover, when the first drive cell 100A is disconnected from the solid-state laser system 1, the first drive cell 100A can create an uninterruptible power supply state by using the battery 104 and thus can maintain the temperature of the fourth CLBO crystal 102 of the first drive cell 100A.

Furthermore, even at emergency power interruption, the first drive cell 100A and the first backup cell 100B can each perform temperature maintenance and conservation of the fourth CLBO crystal 102 by using the battery 104.

5. Embodiment 2

5.1 Configuration

Figure 6:
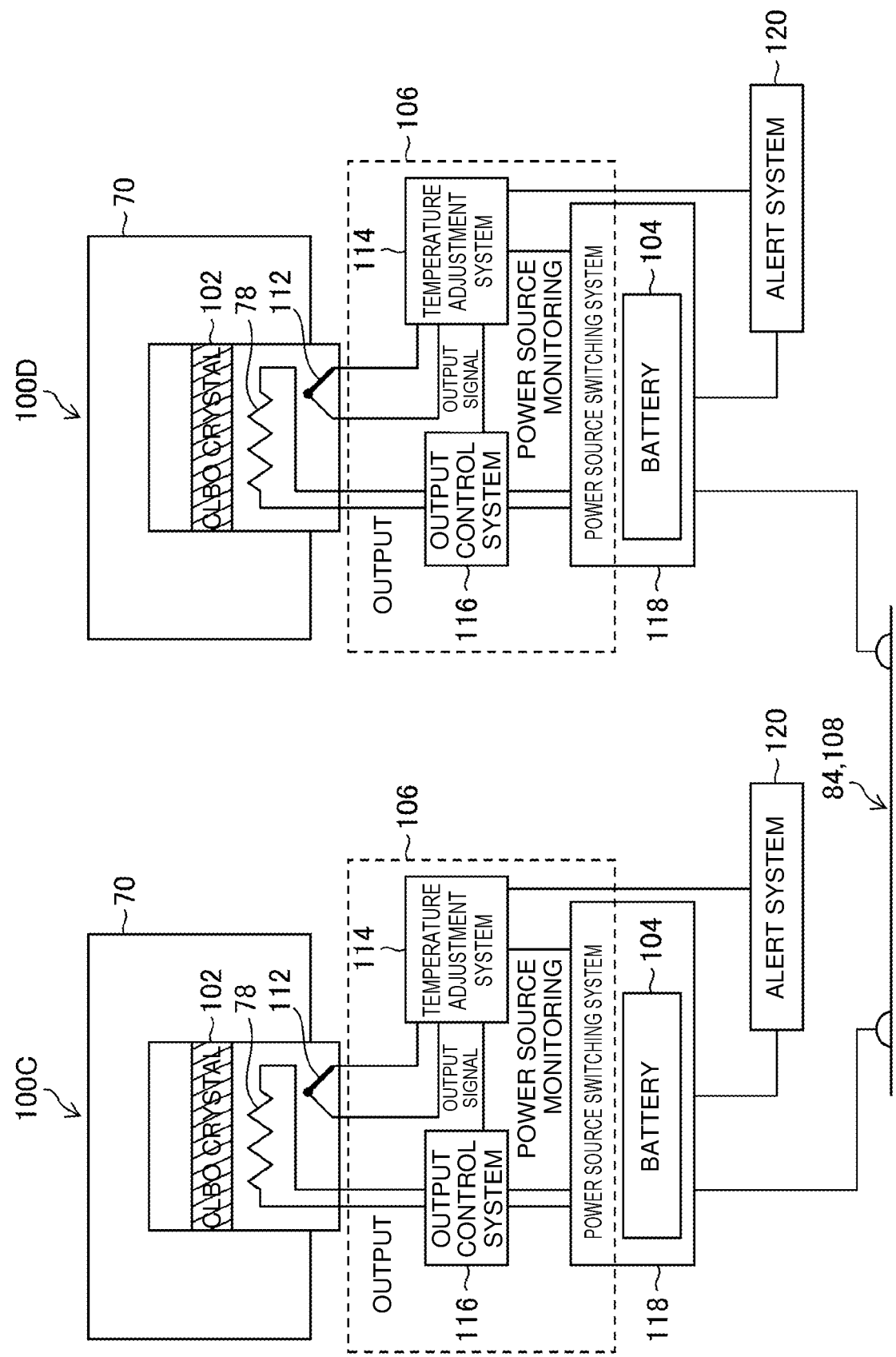
FIG. 6 is a diagram schematically illustrating the configuration of a second drive cell and a second backup cell according to Embodiment 2.

FIG. 6 is a diagram schematically illustrating the configuration of a second drive cell 100C and a second backup cell 100D as CLBO crystal cells according to Embodiment 2. The second drive cell 100C and the second backup cell 100D are each an example of the "wavelength conversion apparatus" in the present disclosure and included in an uninterruptible power supply system or a power source management system. Difference from the first drive cell 100A and the first backup cell 100B illustrated in FIG. 3 will be described below.

The second drive cell 100C and the second backup cell 100D each include a first temperature sensor 112 inside the first container 70.

In addition, the second drive cell 100C and the second backup cell 100D each include a temperature adjustment system 114, an output control system 116, and a power source switching system 118 in the temperature control unit 106. Furthermore, the second drive cell 100C and the second backup cell 100D each include an alert system 120.

The power source switching system 118 has a power source monitoring function and switches power sources without power supply interruption when electric power supply from one of the laser power source 84 or the external power source 108 is interrupted or resumed. Specifically, the power source switching system 118 switches whether electric power supply to the first heater 78 and the temperature control unit 106 is performed by the laser power source 84 or the external power source 108 or performed by the battery 104. At the switching, the power source switching system 118 continues electric power supply to the first heater 78 and the temperature control unit 106 without interruption. The power source switching system 118 may supply electric power from the laser power source 84 or the external power source 108 to the first heater 78 and the temperature control unit 106 through the battery 104.

Furthermore, the solid-state laser system 1 monitors the amount of electrical energy stored in the battery 104 based on a result of detection by a non-illustrated remaining amount sensor of the power source switching system 118 of the second backup cell 100D. Hereinafter, the amount of electrical energy stored in the battery 104 is also referred to as a "battery remaining amount". The battery remaining amount is an example of an "electrical storage amount of the battery" in the present disclosure.

The temperature adjustment system 114 senses anomaly of the battery 104, the laser power source 84, and the external power source 108. When having sensed anomaly, the temperature adjustment system 114 activates the alert system 120 and reports an anomaly state. Examples of the anomaly state include a case in which electric power supply to the first heater 78 is interrupted, a case in which the maximum charging capacity of the battery 104 is equal to or smaller than a threshold value, a case in which the decrease rate of the battery remaining amount is equal to or lower than a threshold value, and a case in which the temperature of the corresponding CLBO crystal is equal to or lower than a threshold value or is equal to or higher than the threshold value.

The temperature adjustment system 114 generates an output signal for controlling an output from the output control system 116 based on a result of measurement by the first temperature sensor 112 and outputs the output signal to the output control system 116. Alternatively, the temperature adjustment system 114 generates an output signal based on a monitoring result of the state of electric power supply from the laser power source 84 or the external power source 108. For example, the temperature adjustment system 114 generates an output signal for switching temperature control modes based on the battery remaining amount.

The output control system 116 changes the amount of electric power supply to the first heater 78 by performing output control on the first heater 78 based on an output signal from the temperature adjustment system 114 by on-off switching or by current and phase.

The second drive cell 100C and the second backup cell 100D are each connected to the laser power source 84 or the external power source 108. In each of the second drive cell 100C and the second backup cell 100D, heating of the fourth CLBO crystal 102 is maintained by the battery 104 when an unanticipated situation occurs to the laser power source 84 or the external power source 108.

The temperature control unit 106, the power source switching system 118, and the alert system 120 may be replaced integrally with the second drive cell 100C or the second backup cell 100D when the second drive cell 100C or the second backup cell 100D is replaced, or may be separated from the second drive cell 100C or the second backup cell 100D.

5.2 Operation

Operation of the second drive cell 100C and the second backup cell 100D will be described below.

While mounted on the solid-state laser system 1 the second drive cell 100C is supplied with electric power from the laser power source 84 to control the temperature of the fourth CLBO crystal 102.

Specifically, the temperature adjustment system 114 of the second drive cell 100C measures the temperature of the fourth CLBO crystal 102 with the first temperature sensor 112. The temperature adjustment system 114 outputs an output signal to the output control system 116 based on the measured temperature. The output control system 116 controls the temperature of the first heater 78 by changing the amount of electric power supply to the first heater 78 based on the output signal from the temperature adjustment system 114. Accordingly, the temperature of the fourth CLBO crystal 102 of the second drive cell 100C is controlled.

While not mounted on the solid-state laser system 1, the second backup cell 100D is supplied with electric power from the battery 104 to control the temperature of the fourth CLBO crystal 102. The second backup cell 100D may be supplied with electric power from the external power source 108 while not mounted on the solid-state laser system 1. Processing of controlling the temperature of the fourth CLBO crystal 102 is same as that of the second drive cell 100C.

When the second drive cell 100C has reached a replacement timing, the user removes the second drive cell 100C from the solid-state laser system 1, and instead, attaches the second backup cell 100D. When the second drive cell 100C is removed from the solid-state laser system 1, the power source of the second drive cell 100C is switched from the laser power source 84 to the battery 104 of the second drive cell 100C without power supply interruption. When the second backup cell 100D is attached to the solid-state laser system 1, the power source of the second backup cell 100D is switched from the battery 104 of the second backup cell 100D to the laser power source 84 without power supply interruption.

The temperature adjustment system 114 generates an output signal based on a monitoring result of the state of electric power supply from the laser power source 84 or the external power source 108. The temperature adjustment system 114 activates the alert system 120 and reports an anomaly state when anomaly has occurred to the battery 104, the laser power source 84, or the external power source 108.

5.3 Effect

The second drive cell 100C and the second backup cell 100D according to Embodiment 2 can perform uninterruptible power supply drive. Specifically, when disconnected from the solid-state laser system 1, the second drive cell 100C and the second backup cell 100D can each create an uninterruptible power supply state by using the battery 104 and maintain the temperature of the fourth CLBO crystal 102.

Moreover, when an unanticipated situation such as emergency power interruption occurs and power cannot be supplied from the laser power source 84 or the external power source 108, it is possible to perform uninterruptible power supply drive by using the battery 104 and perform temperature maintenance and conservation of the fourth CLBO crystal 102.

6. Embodiment 3

6.1 Configuration

Figure 7:
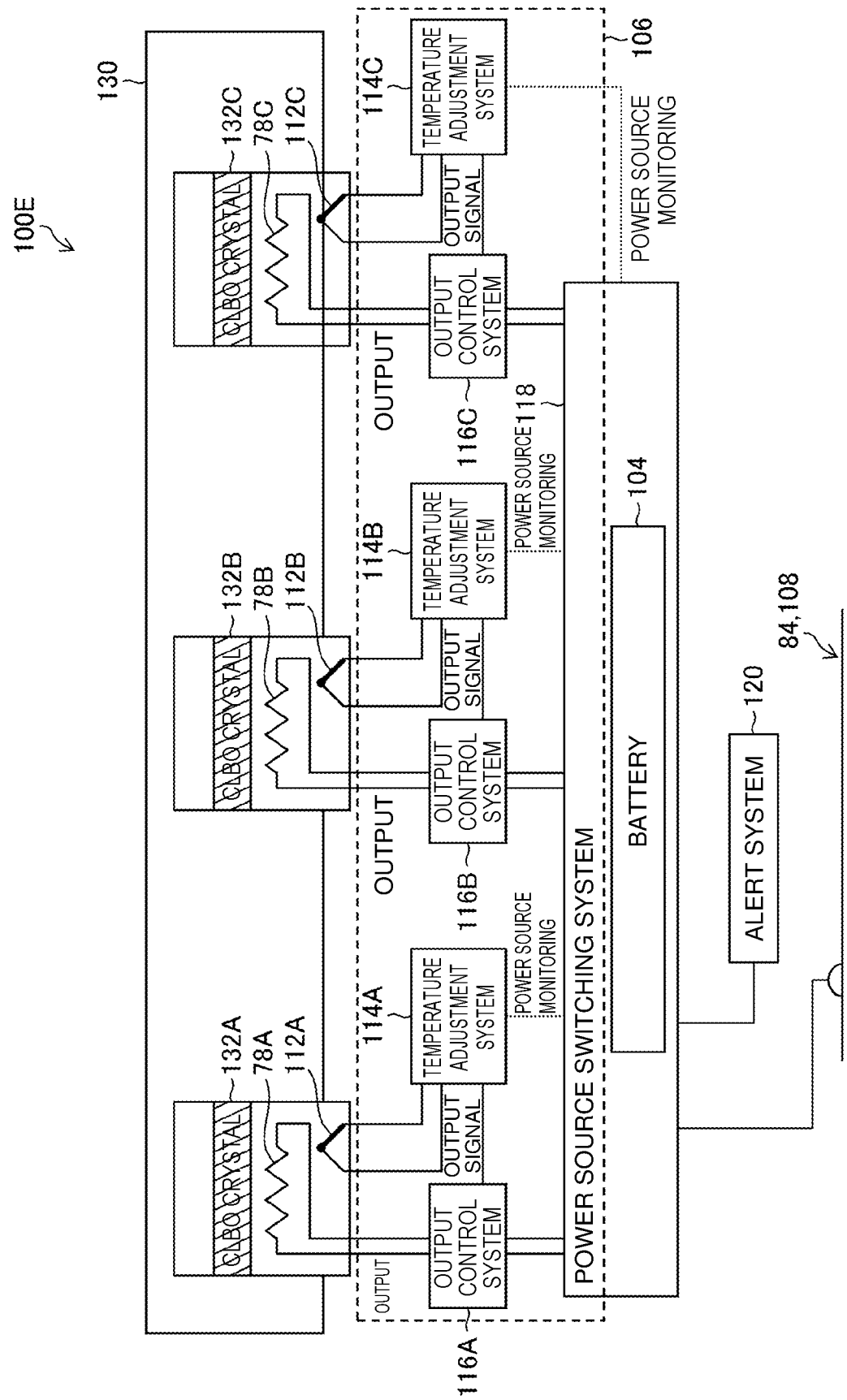
FIG. 7 is a diagram schematically illustrating the configuration of a fourth CLBO crystal cell according to Embodiment 3.

A configuration in which one CLBO crystal cell includes a plurality of CLBO crystals will be described below. FIG. 7 is a diagram schematically illustrating the configuration of a fourth CLBO crystal cell 100E according to Embodiment 3. The fourth CLBO crystal cell 100E includes three CLBO crystals.

As illustrated in FIG. 7, the fourth CLBO crystal cell 100E includes a second container 130. The fourth CLBO crystal cell 100E includes a fifth CLBO crystal 132A, a sixth CLBO crystal 132B, and a seventh CLBO crystal 132C inside the second container 130. The fifth CLBO crystal 132A is an example of a "first non-linear crystal" in the present disclosure. The sixth CLBO crystal 132B is an example of a "second non-linear crystal" in the present disclosure. The fifth CLBO crystal 132A, the sixth CLBO crystal 132B, and the seventh CLBO crystal 132C correspond to, for example, the first CLBO crystal 32, the second CLBO crystal 36, and the third CLBO crystal 40 of Embodiment 1, respectively.

The fifth CLBO crystal 132A, the sixth CLBO crystal 132B, and the seventh CLBO crystal 132C are each fixed to a non-illustrated crystal holder and are sequentially disposed on the optical path of a laser beam incident through a non-illustrated entrance window. The fourth CLBO crystal cell 100E may include a non-illustrated light condensing lens, a non-illustrated collimator lens, a non-illustrated dichroic mirror, and a non-illustrated high reflective mirror inside the second container 130.

The fourth CLBO crystal cell 100E also includes a second heater 78A, a third heater 78B, a fourth heater 78C, a second temperature sensor 112A, a third temperature sensor 112B, and a fourth temperature sensor 112C inside the second container 130.

The second heater 78A is disposed at a position for heating the fifth CLBO crystal 132A. The third heater 78B is disposed at a position for heating the sixth CLBO crystal 132B. The fourth heater 78C is disposed at a position for heating the seventh CLBO crystal 132C.

The second temperature sensor 112A is disposed at a position for measuring the temperature of the fifth CLBO crystal 132A. The third temperature sensor 112B is disposed at a position for measuring the temperature of the sixth CLBO crystal 132B. The fourth temperature sensor 112C is disposed at a position for measuring the temperature of the seventh CLBO crystal 132C.

The fourth CLBO crystal cell 100E also includes a first temperature adjustment system 114A, a second temperature adjustment system 114B, a third temperature adjustment system 114C, a first output control system 116A, a second output control system 116B, and a third output control system 116C in the temperature control unit 106.

The first temperature adjustment system 114A is connected to the second temperature sensor 112A. Similarly, the second temperature adjustment system 114B is connected to the third temperature sensor 112B, and the third temperature adjustment system 114C is connected to the fourth temperature sensor 112C.

The first output control system 116A is connected to the second heater 78A. The second output control system 116B is connected to the third heater 78B. Similarly, the third output control system 116C is connected to the fourth heater 78C.

The first temperature adjustment system 114A, the second temperature adjustment system 114B, the third temperature adjustment system 114C, the first output control system 116A, the second output control system 116B, and the third output control system 116C are connected to the power source switching system 118. The power source switching system 118 includes one battery 104. The power source switching system 118 is an example of a "first controller" and a "second controller" in the present disclosure.

In this manner, the fifth CLBO crystal 132A, the sixth CLBO crystal 132B, and the seventh CLBO crystal 132C in the fourth CLBO crystal cell 100E are each connected to the corresponding one of the second heater 78A, the third heater 78B, and the fourth heater 78C and the corresponding one of the first temperature adjustment system 114A, the second temperature adjustment system 114B, and the third temperature adjustment system 114C as independent systems. The power source switching system 118, which includes the battery 104, the laser power source 84, and the external power source 108, and the alert system 120 are shared. The alert system 120 individually identifies and monitors each CLBO crystal and has a function to report which CLBO crystal is in what anomaly state when reporting an anomaly state.

In a system in which a plurality of fourth CLBO crystal cells 100E are used, each fourth CLBO crystal cell 100E serves as one cell system including the battery 104, and each cell system is connected to the laser power source 84 or the external power source 108 as in Embodiment 2.

6.2 Operation

Operation of the fourth CLBO crystal cell 100E will be described below.

The wavelength of a pulse laser beam incident through a non-illustrated entrance window of the fourth CLBO crystal cell 100E is converted as the pulse laser beam is sequentially incident on the fifth CLBO crystal 132A, the sixth CLBO crystal 132B, and the seventh CLBO crystal 132C. Then, the pulse laser beam having the converted wavelength is output through a non-illustrated exit window.

While mounted on the solid-state laser system 1, the fourth CLBO crystal cell 100E is supplied with electric power from the laser power source 84 to control the temperatures of the fifth CLBO crystal 132A, the sixth CLBO crystal 132B, and the seventh CLBO crystal 132C.

Specifically, the fourth CLBO crystal cell 100E controls the temperature of the fifth CLBO crystal 132A by controlling the second heater 78A based on the second temperature sensor 112A, the first temperature adjustment system 114A, and the first output control system 116A. Similarly, the fourth CLBO crystal cell 100E controls the temperature of the sixth CLBO crystal 132B by controlling the third heater 78B based on the third temperature sensor 112B, the second temperature adjustment system 114B, and the second output control system 116B. Moreover, the fourth CLBO crystal cell 100E controls the temperature of the seventh CLBO crystal 132C by controlling the fourth heater 78C based on the fourth temperature sensor 112C, the third temperature adjustment system 114C, and the third output control system 116C.

Similarly to Embodiment 2, when the fourth CLBO crystal cell 100E as a drive cell is removed from the solid-state laser system 1, the power source of the fourth CLBO crystal cell 100E is switched from the laser power source 84 to the battery 104 of the fourth CLBO crystal cell 100E without power supply interruption.

When the fourth CLBO crystal cell 100E as a backup cell is attached to the solid-state laser system 1, the power source of the fourth CLBO crystal cell 100E is switched from the battery 104 of the fourth CLBO crystal cell 100E to the laser power source 84 without power supply interruption.

6.3 Effect

With the fourth CLBO crystal cell 100E according to Embodiment 3, it is possible to individually control the temperatures of the fifth CLBO crystal 132A, the sixth CLBO crystal 132B, and the seventh CLBO crystal 132C as a plurality of CLBO crystals included in the fourth CLBO crystal cell 100E.

When the fourth CLBO crystal cell 100E is disconnected from the solid-state laser system 1, it is possible to create an uninterruptible power supply state by using the battery 104, and thus it is possible to maintain the temperatures of the fifth CLBO crystal 132A, the sixth CLBO crystal 132B, and the seventh CLBO crystal 132C.

6.4 Modifications

Among the fifth CLBO crystal 132A, the sixth CLBO crystal 132B, and the seventh CLBO crystal 132C disposed in series, the fifth CLBO crystal 132A and the seventh CLBO crystal 132C may be each a wavelength conversion crystal having a phase matching condition of type 1, and the sixth CLBO crystal 132B may be a wavelength conversion crystal having a phase matching condition of type 2.

In this case, a pulse laser beam having a wavelength of 515 nm and a pulse laser beam having a wavelength of 1553 nm are substantially simultaneously incident with substantially identical optical axes through a non-illustrated entrance window. The incident angle on the fifth CLBO crystal 132A is adjusted so that the pulse laser beam having a wavelength of 515 nm satisfies its phase matching condition. As a result, a pulse laser beam having a wavelength of 257.5 nm corresponding to the second harmonic of the pulse laser beam having a wavelength of 515 nm is generated through the fifth CLBO crystal 132A. Accordingly, the fifth CLBO crystal 132A outputs the pulse laser beam having a wavelength of 257.5 nm and the pulse laser beam having a wavelength of 1553 nm.

The pulse laser beam having a wavelength of 257.5 nm and the pulse laser beam having a wavelength of 1553 nm are substantially simultaneously incident on the sixth CLBO crystal 132B with substantially identical optical axes.

The incident angle on the sixth CLBO crystal 132B is adjusted so that the pulse laser beam having a wavelength of 257.5 nm and the pulse laser beam having a wavelength of 1553 nm satisfy its phase matching condition. As a result, a pulse laser beam having a wavelength of 221 nm, which is the sum frequency of the pulse laser beam having a wavelength of 257.5 nm and the pulse laser beam having a wavelength of 1553 nm is generated through the sixth CLBO crystal 132B. Accordingly, the sixth CLBO crystal 132B outputs the pulse laser beam having a wavelength of 221 nm, the pulse laser beam having a wavelength of 257.5 nm, and the pulse laser beam having a wavelength of 1553 nm.

The pulse laser beam having a wavelength of 221 nm, the pulse laser beam having a wavelength of 257.5 nm, and the pulse laser beam having a wavelength of 1553 nm are incident on the seventh CLBO crystal 132C.

The incident angle on the seventh CLBO crystal 132C is adjusted so that the pulse laser beam having a wavelength of 221 nm and the pulse laser beam having a wavelength of 1553 nm satisfy its phase matching condition. As a result, a pulse laser beam having a wavelength of 193 nm, which is the sum frequency of the pulse laser beam having a wavelength of 221 nm and the pulse laser beam having a wavelength of 1553 nm is generated through the seventh CLBO crystal 132C. The pulse laser beam having a wavelength of 193 nm is output through a non-illustrated exit window.

Alternatively, among the fifth CLBO crystal 132A, the sixth CLBO crystal 132B, and the seventh CLBO crystal 132C, the fifth CLBO crystal 132A and the sixth CLBO crystal 132B may be wavelength conversion crystals having a phase matching condition of type 1, and the seventh CLBO crystal 132C may a wavelength conversion crystal having a phase matching condition of type 2.

7. Embodiment 4

7.1 Configuration

Figure 8:
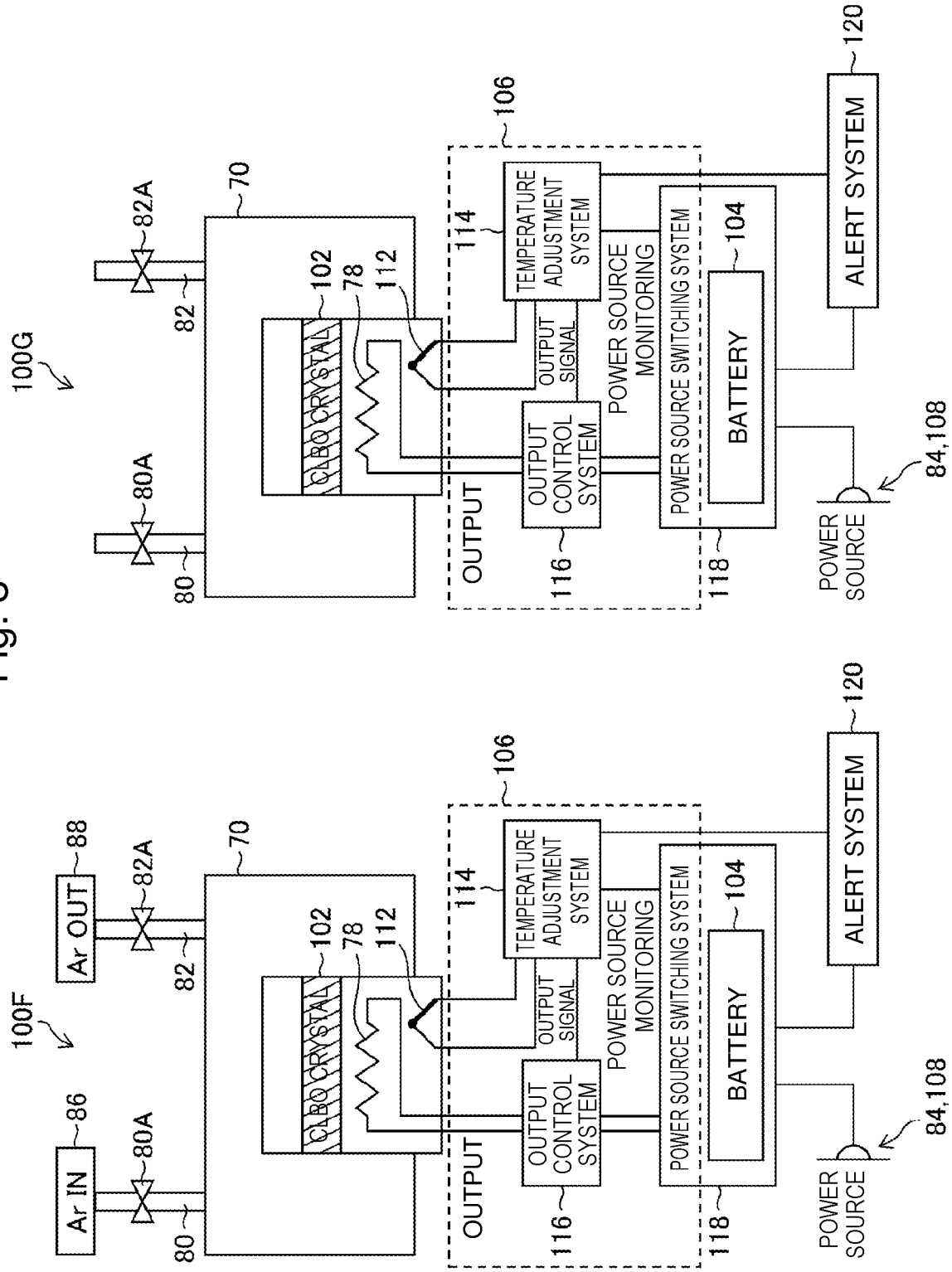
FIG. 8 is a diagram schematically illustrating the configuration of a third drive cell and a third backup cell according to Embodiment 4.

FIG. 8 is a diagram schematically illustrating the configuration of a third drive cell 100F and a third backup cell 100G as CLBO crystal cells according to Embodiment 4. Difference from the second drive cell 100C and the second backup cell 100D illustrated in FIG. 6 will be described below.

The third drive cell 100F and the third backup cell 100G are CLBO crystal cells having identical configurations. The third drive cell 100F is a CLBO crystal cell in wavelength conversion operation in the solid-state laser system 1. The third drive cell 100F may be any of the first CLBO crystal cell 34, the second CLBO crystal cell 38, and the third CLBO crystal cell 42 illustrated in FIG. 1. The third backup cell 100G is a CLBO crystal cell in standby for replacement.

The third drive cell 100F and the third backup cell 100G each include the Ar gas supply pipe 80 for supplying Ar gas into the first container 70, and the Ar gas discharge pipe 82. Ar gas is an example of "inert gas" in the present disclosure. The Ar gas supply pipe 80 is provided with a supply valve 80A. The Ar gas discharge pipe 82 is provided with a discharge valve 82A. The supply valve 80A is a normally-closed valve configured to automatically open when Ar gas is to be supplied and automatically close when Ar gas supply is to be stopped. The discharge valve 82A is a normally-closed valve configured to automatically open when Ar gas is to be discharged and automatically close when Ar gas discharge is to be stopped.

The supply valve 80A and the discharge valve 82A of the third drive cell 100F may open and maintain opened states when the third drive cell 100F is attached to the solid-state laser system 1, and may close and maintain closed states when the third drive cell 100F is removed from the solid-state laser system 1. Similarly, the supply valve 80A and the discharge valve 82A of the third backup cell 100G may open and maintain opened states when the third backup cell 100G is attached to the solid-state laser system 1, and may close and maintain closed states when the third backup cell 100G is removed from the solid-state laser system 1.

In the third drive cell 100F, the Ar gas supply pipe 80 is connected to the Ar gas supply apparatus 86, and the Ar gas discharge pipe 82 is connected to the Ar gas discharge apparatus 88. The Ar gas supply pipe 80 and the Ar gas supply apparatus 86 may be disconnected when dehydration of the third backup cell 100G is completed and the third backup cell 100G is in standby for replacement. Similarly, the Ar gas discharge pipe 82 and the Ar gas discharge apparatus 88 may be disconnected.

7.2 Operation

Operation of the third drive cell 100F and the third backup cell 100G will be described below.

Figure 9:
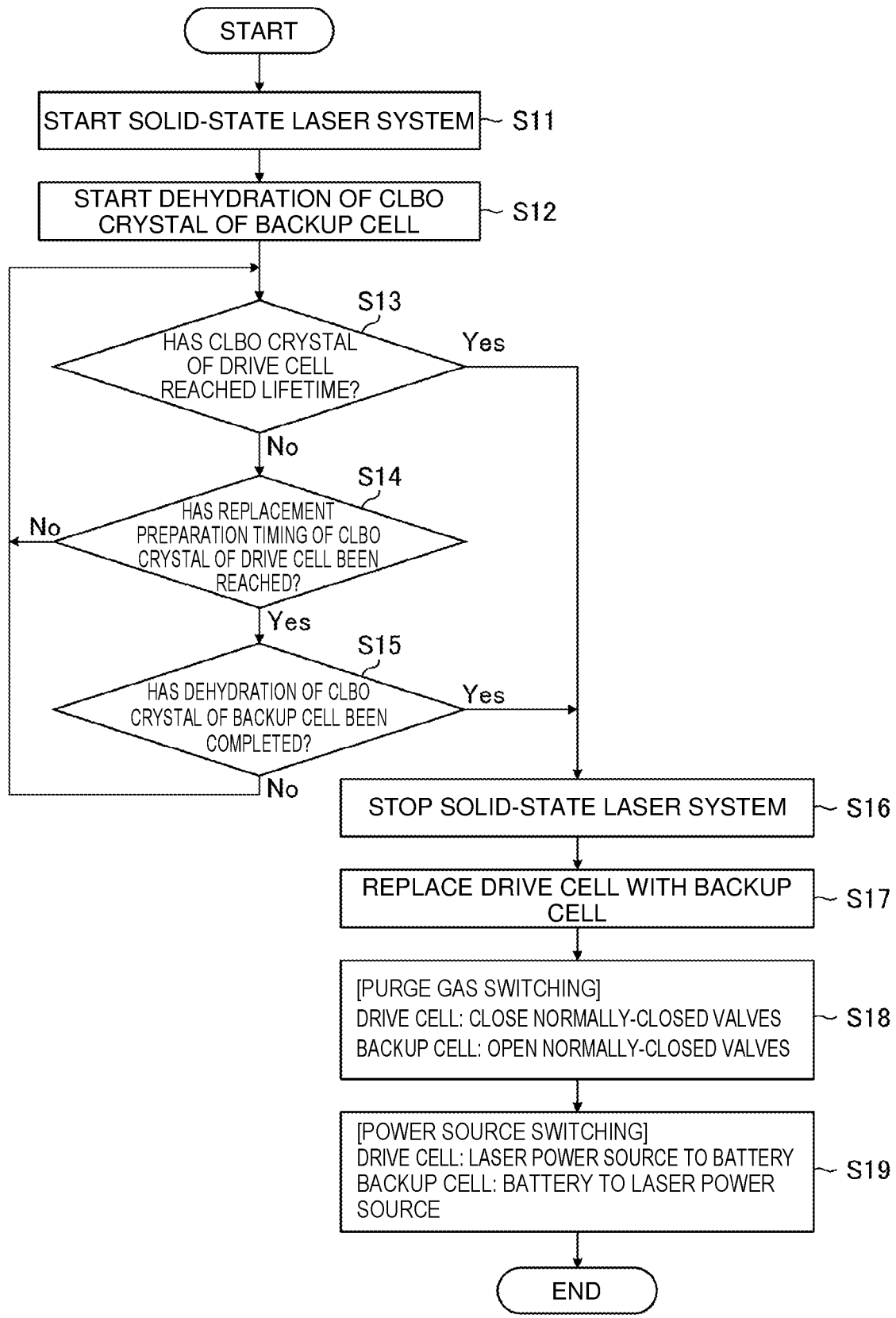
FIG. 9 is a flowchart illustrating replacement processing of the third drive cell with the third backup cell.

FIG. 9 is a flowchart illustrating replacement processing of the third drive cell 100F with the third backup cell 100G. In this example, the third drive cell 100F mounted on the solid-state laser system 1 is replaced with the third backup cell 100G.

At step S11, the solid-state laser system 1 is started.

At step S12, the solid-state laser system 1 starts dehydration by heating the fourth CLBO crystal 102 of the third backup cell 100G. The heating of the fourth CLBO crystal 102 of the third backup cell 100G is performed by the first heater 78 of the third backup cell 100G. The temperature of the first heater 78 is managed by the temperature control unit 106. The third backup cell 100G is supplied with electric power from the battery 104. To proceed the dehydration in the third backup cell 100G, Ar gas is circulated through the Ar gas supply pipe 80 and the Ar gas discharge pipe 82 together with the heating. $N_2$ gas may be circulated in place of Ar gas.

At step S13, the solid-state laser system 1 determines whether the fourth CLBO crystal 102 of the third drive cell 100F has reached its lifetime. The lifetime determination is performed as in Embodiment 1. When the fourth CLBO crystal 102 has not reached its lifetime, the solid-state laser system 1 performs processing at step S14. When the fourth CLBO crystal 102 has reached its lifetime, the solid-state laser system 1 performs processing at step S16. Step S16 will be described later.

At step S14, the solid-state laser system 1 determines whether the replacement preparation timing of the fourth CLBO crystal 102 of the third drive cell 100F has been reached. The replacement preparation timing determination is performed as in Embodiment 1. When the replacement preparation timing of the fourth CLBO crystal 102 has not been reached, the solid-state laser system 1 performs processing at step S13. When the replacement preparation timing of the fourth CLBO crystal 102 has been reached, the solid-state laser system 1 performs processing at step S15.

At step S15, the solid-state laser system 1 determines whether the dehydration of the fourth CLBO crystal 102 of the third backup cell 100G has been completed. The dehydration completion determination is performed as in Embodiment 1. When the dehydration of the fourth CLBO crystal 102 has not been completed, the solid-state laser system 1 performs processing at step S13. When the dehydration of the fourth CLBO crystal 102 has been completed, the third backup cell 100G is disconnected from the Ar gas supply apparatus 86 so that replacement can be executed at an optional timing. FIG. 8 illustrates the configuration of the third backup cell 100G right after the disconnection. The inside of the third backup cell 100G is completely separated from the outside by the normally-closed functions of the supply valve 80A and the discharge valve 82A, and the third backup cell 100G is in a state in which purge with Ar gas has been completed. When $N_2$ gas is circulated in place of Ar gas, the third backup cell 100G is in a state in which purge with $N_2$ gas has been completed. When the dehydration has been completed, the solid-state laser system 1 performs processing at step S16.

At step S16, operation of the solid-state laser system 1 is stopped. Subsequently at step S17, the user replaces the third drive cell 100F with the third backup cell 100G by removing the third drive cell 100F from the solid-state laser system 1 and attaching the third backup cell 100G to the solid-state laser system 1.

At step S18, along with the replacement of the third drive cell 100F with the third backup cell 100G at step S17, inert gas purge operation is automatically performed by the supply valve 80A and the discharge valve 82A of each of the third drive cell 100F and the third backup cell 100G. Specifically, the supply valve 80A and the discharge valve 82A of the third drive cell 100F are closed as the third drive cell 100F is removed from the solid-state laser system 1. The supply valve 80A and the discharge valve 82A of the third backup cell 100G are opened as the third backup cell 100G is attached to the solid-state laser system 1. When $N_2$ gas is used as purge gas for the third backup cell 100G, operation to switch circulated gas to Ar gas is needed before wavelength conversion operation after the replacement.

Furthermore, at step S19, the power sources of the third drive cell 100F and the third backup cell 100G are each switched along with the replacement of the third drive cell 100F with the third backup cell 100G at step S17. Specifically, the source of electric power supply to the third drive cell 100F is switched from the laser power source 84 to the battery 104 of the third drive cell 100F. The source of electric power supply to the third backup cell 100G is switched from the battery 104 of the third backup cell 100G to the laser power source 84.

Accordingly, the replacement of the third drive cell 100F with the third backup cell 100G ends.

7.2.1 Automatic Purge Operation and Purge Gas Switching Operation

Figure 10:
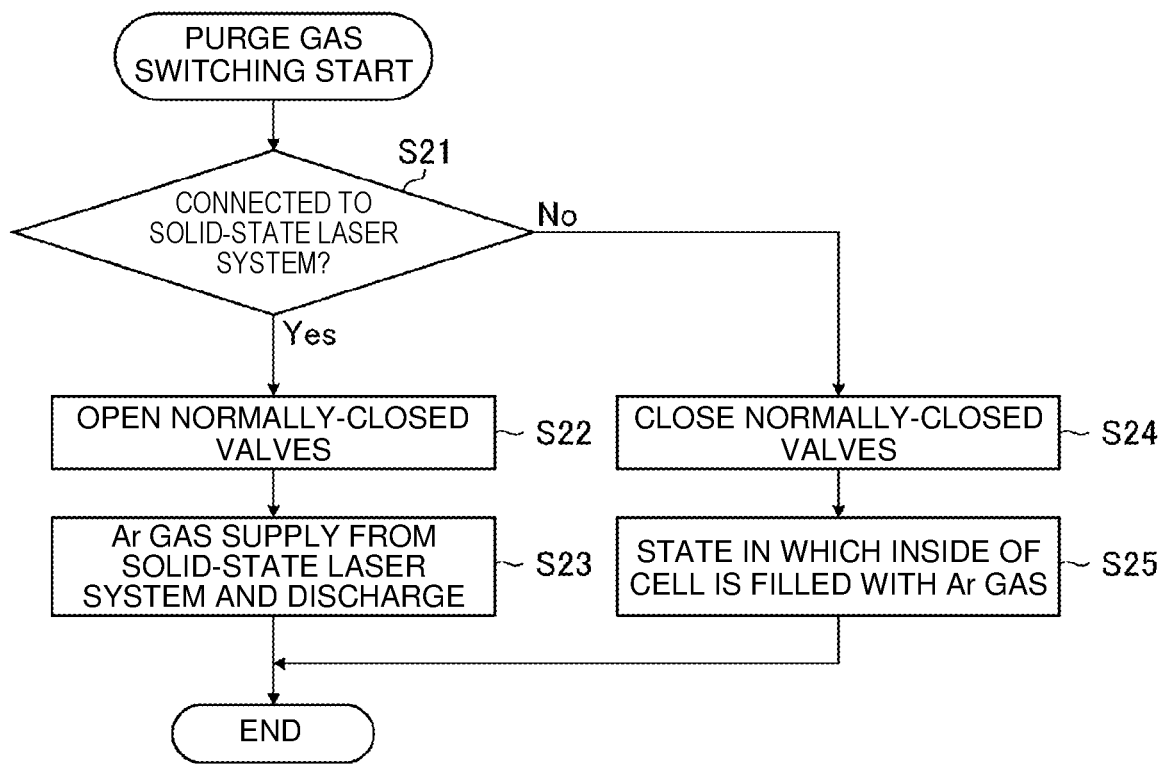
FIG. 10 is a flowchart illustrating details of purge gas switching operation.

FIG. 10 is a flowchart illustrating details of purge gas switching operation corresponding to step S18 in the flowchart illustrated in FIG. 9.

First, the purge gas switching operation of the third drive cell 100F will be described below. At step S21, it is determined whether the third drive cell 100F is connected to the solid-state laser system 1. When the third drive cell 100F is connected to the solid-state laser system 1, the supply valve 80A and the discharge valve 82A of the third drive cell 100F are opened at step S22. Accordingly, at step S23, Ar gas is supplied from the Ar gas supply apparatus 86 to the first container 70 of the third drive cell 100F, and Ar gas is discharged to the Ar gas discharge apparatus 88. After a certain time, gas inside the third drive cell 100F is switched to new Ar gas. When $N_2$ gas is used as purge gas for the third drive cell 100F, the fourth CLBO crystal 102 is not irradiated with a laser beam until the switching to Ar gas is completed, thereby preventing nitride generation at the fourth CLBO crystal 102.

When the third drive cell 100F is not connected to the solid-state laser system 1, the supply valve 80A and the discharge valve 82A of the third drive cell 100F are closed at step S24. Accordingly, at step S25, the first container 70 of the third drive cell 100F is filled with Ar gas supplied until right before the supply valve 80A and the discharge valve 82A are closed.

Subsequently, the purge gas switching operation of the third backup cell 100G will be described below. At step S21, it is determined whether the third backup cell 100G is connected to the solid-state laser system 1. When the third backup cell 100G is connected to the solid-state laser system 1, the supply valve 80A and the discharge valve 82A of the third backup cell 100G are opened at step S22. Accordingly, at step S23, Ar gas is supplied from the Ar gas supply apparatus 86 to the first container 70 of the third backup cell 100G, and Ar gas is discharged to the Ar gas discharge apparatus 88. After a certain time, gas inside the third backup cell 100G is switched to new Ar gas. When $N_2$ gas is used as purge gas for the third backup cell 100G, the fourth CLBO crystal 102 is not irradiated with a laser beam until the switching to Ar gas is completed, thereby preventing nitride generation at the fourth CLBO crystal 102.

When the third backup cell 100G is not connected to the solid-state laser system 1, the supply valve 80A and the discharge valve 82A of the third backup cell 100G are closed at step S24. Accordingly, at step S25, the first container 70 of the third backup cell 100G is filled with Ar gas supplied until right before the supply valve 80A and the discharge valve 82A are closed. In this manner, the purge gas switching processing ends.

7.3 Effect

In each of the third drive cell 100F and the third backup cell 100G according to Embodiment 4, the inside of the first container 70 can be constantly filled with Ar gas, and thus the time of replacement of the third drive cell 100F with the third backup cell 100G can be reduced.

Moreover, the fourth CLBO crystals 102 of the third drive cell 100F and the third backup cell 100G are not exposed to an atmosphere, and thus the conservation property of the fourth CLBO crystal 102 can be improved.

8. Embodiment 5

8.1 Configuration

A configuration of Embodiment 5 is an example in which the second drive cell 100C is connected to the laser power source 84 and the second backup cell 100D is connected to the external power source 108 in the configuration of Embodiment 2.

8.2 Operation

Operation of the second drive cell 100C and the second backup cell 100D according to Embodiment 5 will be described below.

Figure 11:
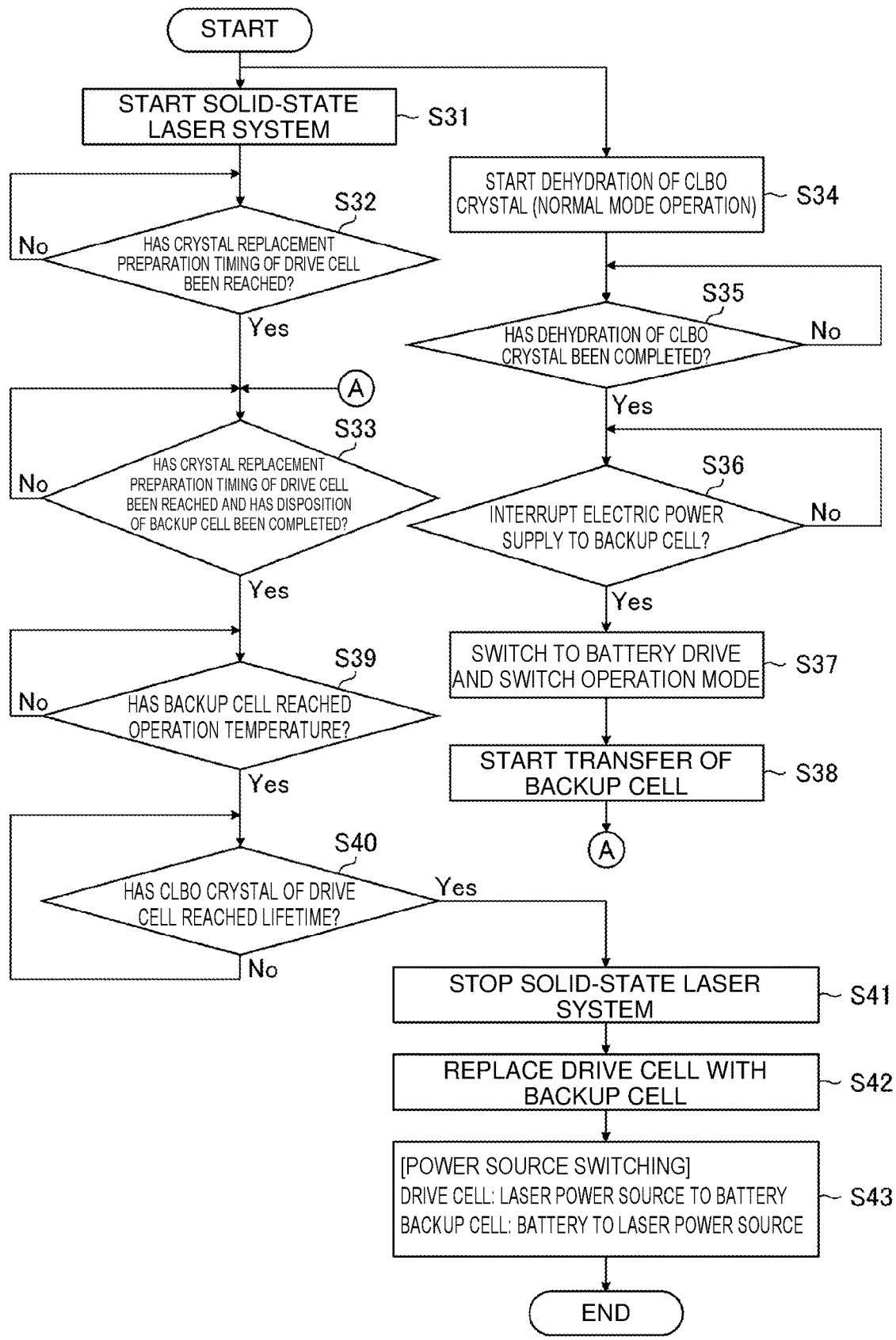
FIG. 11 is a flowchart illustrating temperature control processing of the second drive cell and the second backup cell according to Embodiment 5.

FIG. 11 is a flowchart illustrating temperature control processing of the second drive cell 100C and the second backup cell 100D. In this example, the second drive cell 100C mounted on the solid-state laser system 1 is replaced with the second backup cell 100D. The second backup cell 100D is connected to the external power source 108 and placed at a position separated from the second drive cell 100C, and is moved toward the second drive cell 100C at replacement. The second drive cell 100C may be any of the first CLBO crystal cell 34, the second CLBO crystal cell 38, and the third CLBO crystal cell 42 illustrated in FIG. 1.

At step S31, the solid-state laser system 1 is started.

At step S32, the solid-state laser system 1 determines whether the replacement preparation timing of the fourth CLBO crystal 102 of the second drive cell 100C has been reached. The replacement preparation timing determination is performed as in Embodiment 1. When the replacement preparation timing of the fourth CLBO crystal 102 has not been reached, the solid-state laser system 1 performs processing at step S32. When the replacement preparation timing of the fourth CLBO crystal 102 has been reached, the solid-state laser system 1 performs processing at step S33.

At step S33, the solid-state laser system 1 determines whether the replacement preparation timing of the fourth CLBO crystal 102 of the second drive cell 100C has been reached and disposition of the second backup cell 100D has been completed. When the replacement preparation timing of the fourth CLBO crystal 102 of the second drive cell 100C has been reached and disposition of the second backup cell 100D has been completed, the solid-state laser system 1 performs processing at step S39. When the replacement preparation timing of the fourth CLBO crystal 102 of the second drive cell 100C has not been reached or disposition of the second backup cell 100D has not been completed, the solid-state laser system 1 performs processing at step S33.

The second backup cell 100D is disposed through processes at steps S34 to S38 performed in parallel to execution of steps S31 and S32.

At step S34, the temperature control unit 106 of the second backup cell 100D starts dehydration of the second backup cell 100D by supplying electric power to the first heater 78. Specifically, the temperature control unit 106 heats the fourth CLBO crystal 102 to 120° C., which is suitable for dehydration, by using the first heater 78 of the second backup cell 100D. Hereinafter, temperature control that heats a CLBO crystal at a temperature suitable for dehydration is also referred to as "normal mode operation".

Subsequently at step S35, the temperature control unit 106 of the second backup cell 100D determines whether the dehydration of the fourth CLBO crystal 102 has been completed. The dehydration completion determination is performed as in Embodiment 1. When the dehydration has not been completed, the temperature control unit 106 performs processing at step S35.

Subsequently at step S36, the temperature control unit 106 of the second backup cell 100D determines whether to interrupt electric power supply from the external power source 108 to the second backup cell 100D by determining whether the battery 104 of the second backup cell 100D is supplied with electric power from the external power source 108. Examples of a case in which no electric power is supplied include a case in which electrical connection between the second backup cell 100D and the external power source 108 is intentionally disconnected, a case in which a defect has occurred to contact between the second backup cell 100D and the external power source 108, and a case in which the external power source 108 has failed. In such a case, the temperature control unit 106 performs processing at step S37. While electric power is supplied, the temperature control unit 106 performs processing at step S36.

Subsequently at step S37, the temperature control unit 106 of the second backup cell 100D changes the method of power supply to the first heater 78 and a set temperature of the fourth CLBO crystal 102. First, the power source switching system 118 of the temperature control unit 106 performs switching to battery drive by electrically connecting the battery 104 and the output control system 116. Accordingly, electric energy stored in the battery 104 is supplied as electric power to the first heater 78 through the output control system 116. Subsequently, the temperature control unit 106 sets a target temperature of the fourth CLBO crystal 102 again.

The amount of electrical energy stored in the battery 104 is smaller than that of the external power source. Accordingly, when heating of the first heater 78 is continued in the normal mode operation, temperature control cannot be performed beyond a heating duration based on the amount of electrical energy stored in the battery 104. Thus, at step S37, after switching to the battery drive, the operation mode of the second backup cell 100D is switched based on the ratio of the remaining amount of electric energy stored in the battery 104, thereby extending the heating duration. Specifically, the battery drive is switched to temperature control with which the amount of consumed electric energy is smaller. Hereinafter, temperature control of the fourth CLBO crystal 102 by lowering the target temperature to extend the heating duration is also referred to as "energy saving mode operation".

As described above, the second backup cell 100D, which is provided with a function of switching to the energy saving mode operation, starts determination of necessity for extending the heating duration right after disconnection from the external power source 108, and autonomously changes the method of temperature control of the fourth CLBO crystal 102. The processing at step S37 will be described later in detail.

At step S38, the user starts transfer of the second backup cell 100D being ready for transfer in response to a request from the solid-state laser system 1. During the transfer, as well, the second backup cell 100D controls the temperature of the fourth CLBO crystal 102 and determines necessity for extending the heating duration. Accordingly, disposition of the second backup cell 100D is completed while the temperature control is executed. Thereafter, the solid-state laser system 1 performs processing at step S33.

At step S39 following step S33, the solid-state laser system 1 determines whether the fourth CLBO crystal 102 of the second backup cell 100D has reached its operation temperature based on a result of measurement by the first temperature sensor 112 of the second backup cell 100D. When the fourth CLBO crystal 102 has not reached its operation temperature due to the energy saving mode operation, the solid-state laser system 1 performs the processing at step S39. When the second backup cell 100D has reached its operation temperature, the solid-state laser system 1 performs processing at step S40.

At step S40, the solid-state laser system 1 determines whether the fourth CLBO crystal 102 of the second drive cell 100C has reached its lifetime. The lifetime determination is performed as in Embodiment 1. When the fourth CLBO crystal 102 has not reached its lifetime, the solid-state laser system 1 performs the processing at step S40. When the fourth CLBO crystal 102 has reached its lifetime, the solid-state laser system 1 performs processing at step S41.

At step S41, operation of the solid-state laser system 1 is stopped. Subsequently at step S42, the user replaces the second drive cell 100C with the second backup cell 100D by removing the second drive cell 100C from the solid-state laser system 1 and attaching the second backup cell 100D to the solid-state laser system 1.

At step S43, the power sources of the second drive cell 100C and the second backup cell 100D are each switched along with the replacement of the second drive cell 100C with the second backup cell 100D at step S42. Specifically, the source of electric power supply to the second drive cell 100C is switched from the laser power source 84 to the battery 104 of the second drive cell 100C. The source of electric power supply to the second backup cell 100D is switched from the battery 104 of the second backup cell 100D to the laser power source 84.

Accordingly, the replacement of the second drive cell 100C with the second backup cell 100D ends.

8.2.1 Temperature Control Mode Switching

Figure 12:
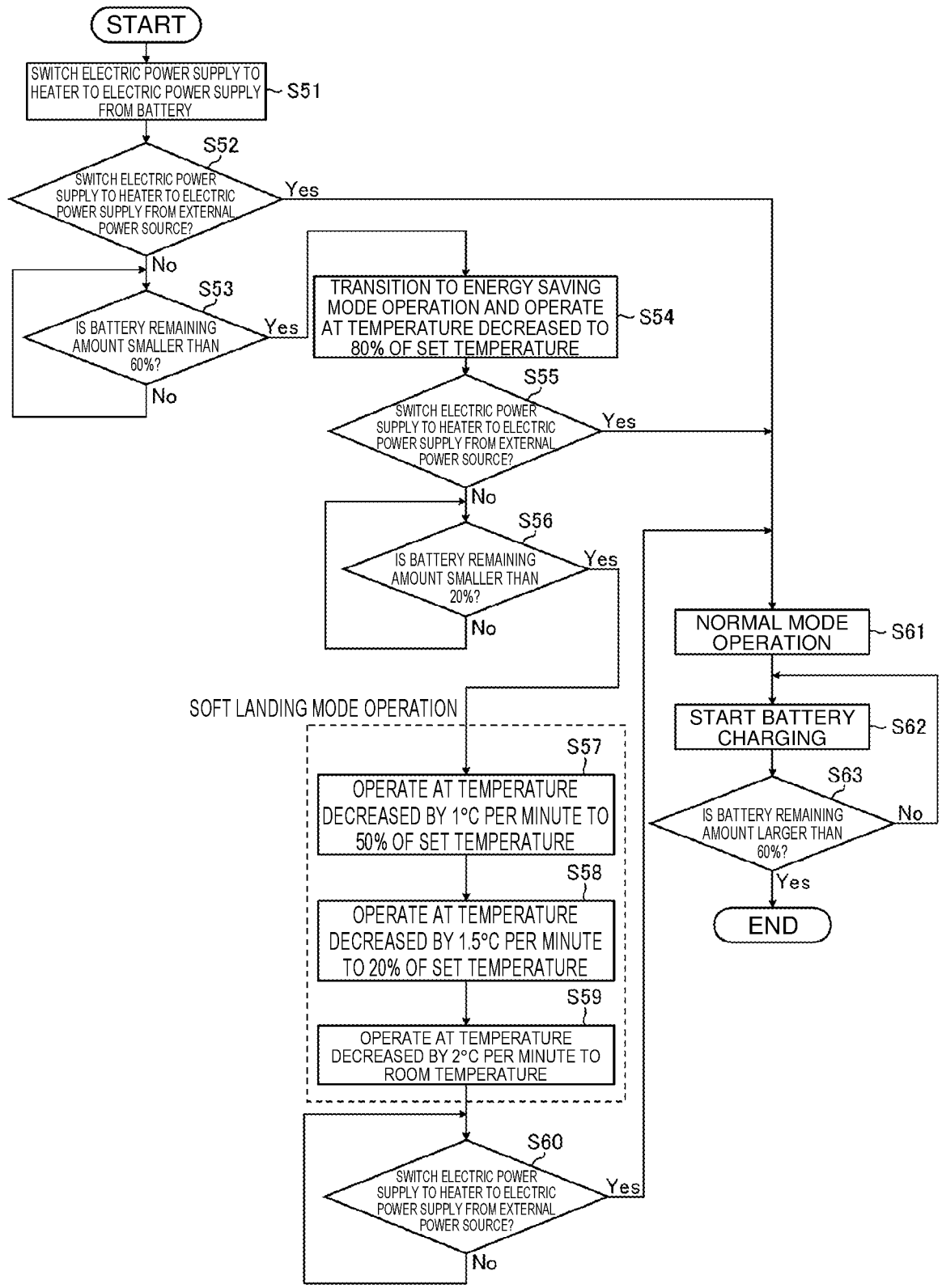
FIG. 12 is a flowchart illustrating details of temperature control mode switching processing of the second backup cell.

FIG. 12 is a flowchart illustrating details of battery drive switching and operation mode switching processing of the second backup cell 100D at step S37 in the flowchart illustrated in FIG. 11.

First at step S51, the power source switching system 118 of the second backup cell 100D interrupts electric power supply from the external power source 108 to the first heater 78 of the second backup cell 100D and starts electric power supply from the battery 104 to the first heater 78. The power source switching system 118 may simultaneously execute these operations, and in this case, may instantaneously switch the source of electric power supply to the first heater 78 from the external power source 108 to the battery 104 without power supply interruption.

At step S52, the power source switching system 118 of the second backup cell 100D determines whether to interrupt electric power supply from the battery 104 to the first heater 78 and start electric power supply from the external power source 108 to the first heater 78. The second backup cell 100D receives electric power supply only from the battery 104 in a duration until the second backup cell 100D is mounted on the solid-state laser system 1 after execution of step S51. When the second backup cell 100D is connected to the external power source 108 again in this duration, the power source switching system 118 interrupts electric power supply from the battery 104 to the first heater 78 and starts electric power supply from the external power source 108 to the first heater 78. The power source switching system 118 may simultaneously execute these operations, and in this case, may instantaneously switch the source of electric power supply to the first heater 78 from the battery 104 to the external power source 108 without power supply interruption. When the source of electric power supply is switched to the external power source 108, processing at step S61 is performed. The processing at step S61 will be described later. When the second backup cell 100D is continuously left to stand only with the battery 104 as the source of electric power supply, processing at step S53 is performed.

At step S53, the power source switching system 118 of the second backup cell 100D monitors the battery remaining amount stored in the battery 104. The temperature of the fourth CLBO crystal 102 is desirably controlled based on the normal mode operation after dehydration is completed as well. However, decrease of the battery remaining amount is fast in the normal mode operation, and thus the battery remaining amount runs out and temperature control of the fourth CLBO crystal 102 is interrupted before the second backup cell 100D is connected to the laser power source 84. To prevent this, the method of temperature control is changed based on the battery remaining amount to avoid occurrence of a situation in which temperature control is interrupted. At step S53, a condition for changing the method of temperature control is set to be that the battery remaining amount is 60% of the maximum electrical storage capacity, and it is determined whether the battery remaining amount is smaller than 60% of the maximum electrical storage capacity. When the battery remaining amount is smaller than 60% of the maximum electrical storage capacity, the power source switching system 118 performs processing at step S54. When the battery remaining amount is not smaller than 60% of the maximum electrical storage capacity, the power source switching system 118 continues monitoring of the battery remaining amount while repeating the processing at step S53.

Subsequently at step S54, the second backup cell 100D is transitioned to the energy saving mode operation. Specifically, the temperature adjustment system 114 changes a set temperature of temperature control so that the temperature of the fourth CLBO crystal 102 becomes equal to 80% of the temperature in the normal mode operation. Then, the output control system 116 decreases the amount of electric power supplied from the battery 104 to the first heater 78 based on information of the new set temperature. The temperature adjustment system 114 decreases the temperature of the fourth CLBO crystal 102 to the new set temperature based on a result of measurement by the first temperature sensor 112, and thereafter, the temperature adjustment system 114 controls the output control system 116 to maintain the new set temperature.

At step S55, the power source switching system 118 of the second backup cell 100D performs processing same as that at step S52. Specifically, when the second backup cell 100D is connected to the external power source 108 again even after transition to the energy saving mode operation, the power source switching system 118 autonomously changes the source of electric power supply to the first heater 78 to the battery 104 and performs the processing at step S61. When the second backup cell 100D is continuously left to stand only with the battery 104 as the source of electric power supply, the power source switching system 118 performs processing at step S56.

At step S56, the power source switching system 118 of the second backup cell 100D performs processing same as that at step S53. Specifically, when the probability that temperature control of the fourth CLBO crystal 102 is interrupted increases even after transition to the energy saving mode operation, the method of temperature control is changed again to avoid occurrence of temperature control interruption. A condition for the change is set to be that the battery remaining amount is 20% of the maximum remaining amount, and the power source switching system 118 determines whether the battery remaining amount is smaller than 20% of the maximum remaining amount. When the battery remaining amount is smaller than 20% of the maximum remaining amount, the power source switching system 118 performs the processing at step S56. When the battery remaining amount is not smaller than 20% of the maximum remaining amount, the power source switching system 118 continues monitoring of the battery remaining amount while repeating the processing at step S56.

The processing at steps S57 to S59 corresponds to processing of stopping heating of the fourth CLBO crystal 102 of the second backup cell 100D. When the second backup cell 100D is to be operated until the battery remaining amount runs out, a situation in which electric power supply to the first heater 78 is suddenly interrupted occurs. In this case, the temperature of the fourth CLBO crystal 102 abruptly decreases right after the battery remaining amount runs out. This abrupt temperature change damages the fourth CLBO crystal 102. To prevent this, the second backup cell 100D is provided with a control function with which the temperature of the fourth CLBO crystal 102 does not abruptly decrease. Hereinafter, temperature control in which heating is stopped while the temperature of the fourth CLBO crystal 102 is decreased at stages is also referred to as "soft landing mode operation". The processing at steps S57 to S59 correspond to temperature control by the soft landing mode operation.

Step S57 is the first processing of the soft landing mode operation. At step S57, the temperature adjustment system 114 of the second backup cell 100D changes settings of temperature control so that the temperature of the fourth CLBO crystal 102 becomes equal to 50% of the temperature in the normal mode operation at the change amount of 1° C. per minute. Then, the output control system 116 continuously changes the temperature of the fourth CLBO crystal 102 while controlling the amount of electric power supplied from the battery 104 to the first heater 78 based on information of the changed settings and a result of measurement by the first temperature sensor 112. After the fourth CLBO crystal 102 decreases to 50% of the temperature in the normal mode operation, the temperature adjustment system 114 performs processing at step S58.

Step S58 is the next processing of the soft landing mode operation. At step S58, the temperature adjustment system 114 of the second backup cell 100D changes settings of temperature control so that the temperature of the fourth CLBO crystal 102 becomes equal to 20% of the temperature in the normal mode operation at the change amount of 1.5° C. per minute. Then, the output control system 116 continuously changes the temperature of the fourth CLBO crystal 102 while controlling the amount of electric power supplied from the battery 104 to the first heater 78 based on information of the changed settings and a result of measurement by the first temperature sensor 112. After the fourth CLBO crystal 102 decreases to 20% of the temperature in the normal mode operation, the temperature adjustment system 114 performs processing at step S59.

Step S59 is the last processing of the soft landing mode operation. At step S59, the temperature adjustment system 114 of the second backup cell 100D changes settings of temperature control so that the temperature of the fourth CLBO crystal 102 becomes equal to room temperature at the change amount of 2° C. per minute. Then, the output control system 116 continuously changes the temperature of the fourth CLBO crystal 102 while controlling electric power supplied from the battery 104 to the first heater 78 based on information of the changed settings and a result of measurement by the first temperature sensor 112. After the fourth CLBO crystal 102 decreases to room temperature, the temperature adjustment system 114 stops temperature control of the fourth CLBO crystal 102 by the temperature control unit 106. Thereafter, the temperature adjustment system 114 performs processing at step S60.

To further decrease the probability that the fourth CLBO crystal 102 of the second backup cell 100D is damaged in the soft landing mode operation, it is useful that the change amounts per minute at steps S57 to S59 are each set to be smaller by 0.5° C. To decrease the duration of the soft landing mode operation, it is useful to set that the change amount of temperature per minute increases as processing proceeds. For example, the duration of the soft landing mode operation can be decreased while the probability that the fourth CLBO crystal 102 is damaged is decreased, when the relation $\Delta t57<\Delta t58<\Delta t59$ is set to hold, where $\Delta t57$, $\Delta t58$, and $\Delta t59$ represent the change amounts of temperature per minute in the processing at steps S57, S58, and S59, respectively.

Subsequently at step S60, the power source switching system 118 of the second backup cell 100D performs processing same as that at step S52. The solid-state laser system 1 controls the power source switching system 118 and charges the battery 104 by the external power source 108. Specifically, when the second backup cell 100D is connected to the external power source 108 again even after transition to the soft landing mode operation, the power source switching system 118 autonomously changes the source of electric power supply to the first heater 78 to the battery 104 and performs the processing at step S61. When the second backup cell 100D is continuously left to stand only with the battery 104 as the source of electric power supply, the power source switching system 118 continues the processing at step S60. Accordingly, the second backup cell 100D is maintained in a stopped state.

At step S61, the solid-state laser system 1 maintains the normal mode operation when the second backup cell 100D is set to the normal mode operation, or switches to the normal mode operation when the second backup cell 100D is set to the energy saving mode operation or the soft landing mode operation.

At step S62, the power source switching system 118 of the second backup cell 100D supplies electric power from the external power source 108 to the battery 104 as well and starts monitoring of the battery remaining amount.

Lastly at step S63, the power source switching system 118 of the second backup cell 100D sets, as a condition for monitoring the battery remaining amount of the battery 104, that the battery remaining amount is 60% of the maximum electrical storage capacity, and determines whether the battery remaining amount is larger than 60% of the maximum electrical storage capacity. When the battery remaining amount is larger than 60% of the maximum electrical storage capacity, the power source switching system 118 performs the processing at step S38 in FIG. 11. When the battery remaining amount is not larger than 60% of the maximum electrical storage capacity, the power source switching system 118 continues battery charging and monitoring of the battery remaining amount while continuing the processing at steps S62 and S63.

8.3 Effect

According to the temperature control processing of Embodiment 5, the second backup cell 100D has a function to autonomously select any of the external power source 108 and the battery 104 and instantaneously switch the source of electric power supply to the first heater 78 without power supply interruption. Accordingly, the second backup cell 100D can continue temperature control even in a duration in which electric power supply from the external power source 108 is interrupted. The second backup cell 100D also has a function to autonomously select an operation mode and decrease electric power supply to the first heater 78 when the battery 104 is selected. Accordingly, the second backup cell 100D can continue temperature control even when electric power supply from the external power source 108 is interrupted for a long duration. In this case, when the battery remaining amount significantly decreases, the second backup cell 100D selects an operation mode to stop temperature control, and thus the fourth CLBO crystal 102 is not damaged.

9. Embodiment 6

9.1 Configuration

Figure 13:
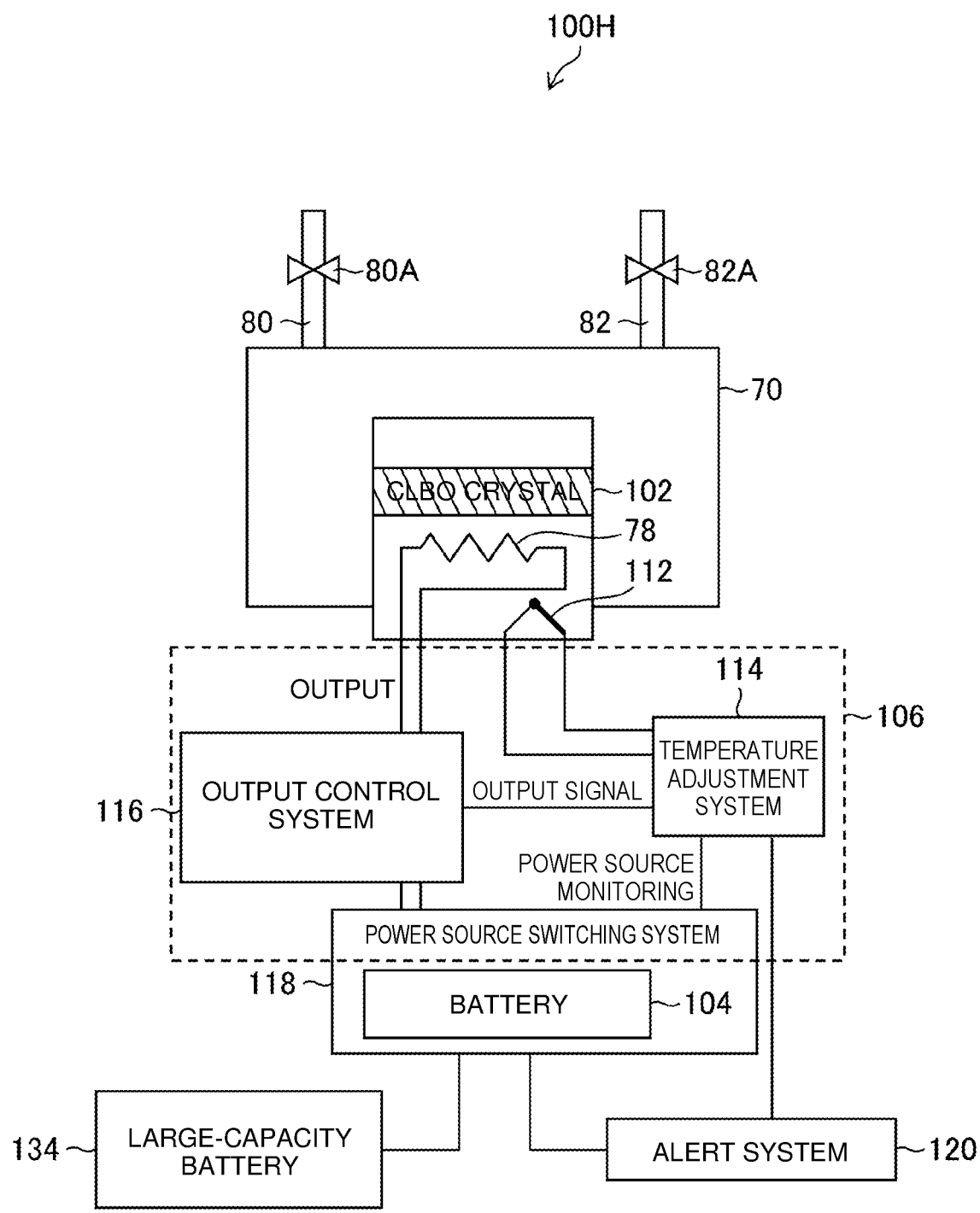
FIG. 13 is a diagram schematically illustrating the configuration of a fifth CLBO crystal cell according to Embodiment 6.

FIG. 13 is a diagram schematically illustrating the configuration of a fifth CLBO crystal cell 100H according to Embodiment 6. The configuration of the fifth CLBO crystal cell 100H is same as those of the third drive cell 100F and the third backup cell 100G illustrated in FIG. 8 but is different in that the fifth CLBO crystal cell 100H is connected to a large-capacity battery 134. The large-capacity battery 134 is an example of a an "external power source" in the present disclosure. The large-capacity battery 134 supplies electric power to the first heater 78 and the temperature control unit 106 through the battery 104.

Figure 14:
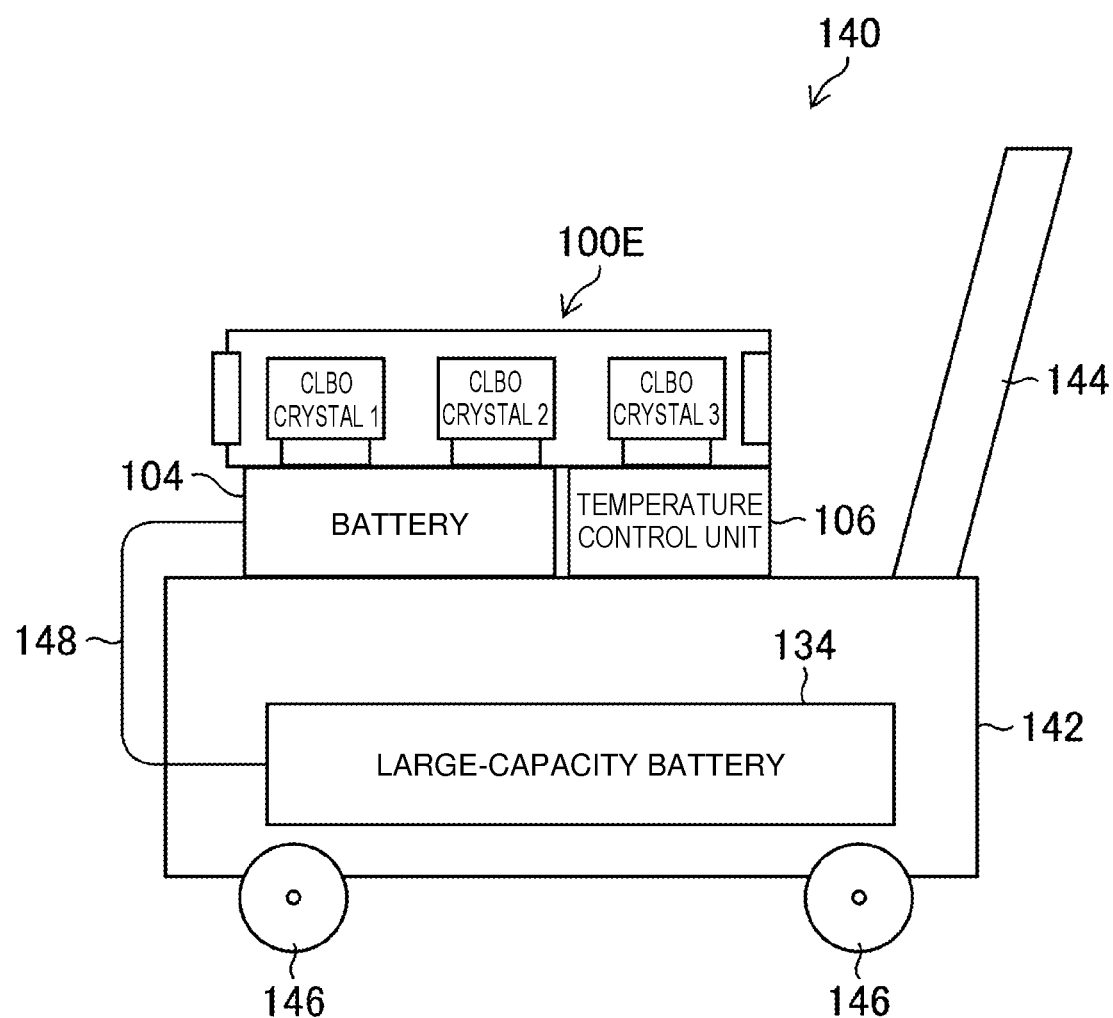
FIG. 14 is a diagram schematically illustrating the configuration of a large-capacity battery transfer truck according to Embodiment 6.

FIG. 14 is a diagram schematically illustrating the configuration of a large-capacity battery transfer truck 140 according to Embodiment 6. As illustrated in FIG. 14, the large-capacity battery transfer truck 140 includes a cargo bed 142, a handle 144, wheels 146, and a charging cable 148.

The cargo bed 142 has a box shape with the large-capacity battery 134 arranged therein. A CLBO crystal cell can be placed on the upper surface of the cargo bed 142, and the fourth CLBO crystal cell 100E including the battery 104 and the temperature control unit 106 is placed on the cargo bed 142 in the example illustrated in FIG. 14. The fifth CLBO crystal cell 100H illustrated in FIG. 13 or a plurality of CLBO crystal cells may be placed on the cargo bed 142.

The handle 144 is provided to the cargo bed 142. The handle 144 is a member that a user grasps when moving the large-capacity battery transfer truck 140. The wheels 146 are provided on the front, back, right, and left sides of the lower surface of the cargo bed 142. The wheels 146 rotate and facilitate movement of the large-capacity battery transfer truck 140 by the user.

The charging cable 148 electrically connects the battery 104 of the fourth CLBO crystal cell 100E placed on the cargo bed 142 and the large-capacity battery 134 provided in the large-capacity battery transfer truck 140.

The large-capacity battery transfer truck 140 may be provided with the Ar gas supply apparatus 86 and the Ar gas discharge apparatus 88 (refer to FIG. 2) for purging Ar gas inside the second container 130 of the fourth CLBO crystal cell 100E placed on the cargo bed 142.

9.2 Operation

Electric power is supplied from the large-capacity battery 134 to the fourth CLBO crystal cell 100E mounted on the large-capacity battery transfer truck 140.

9.3 Effect

The size of a battery for a CLBO crystal cell is restricted by the internal space of the solid-state laser system 1, and as a result, the capacity of the battery is restricted. Thus, the capacity of the battery becomes insufficient in some cases, depending on the time of transfer of the CLBO crystal cell. The large-capacity battery transfer truck 140 according to Embodiment 6 enables power supply from an external power source to the CLBO crystal cell together with the transfer. The large-capacity battery 134 can perform electric power supply to the first heater 78 and the temperature control unit 106 and charging of the battery 104. Accordingly, a system continuation time at movement can be increased.

10. Embodiment 7

10.1 Configuration

Figure 15:
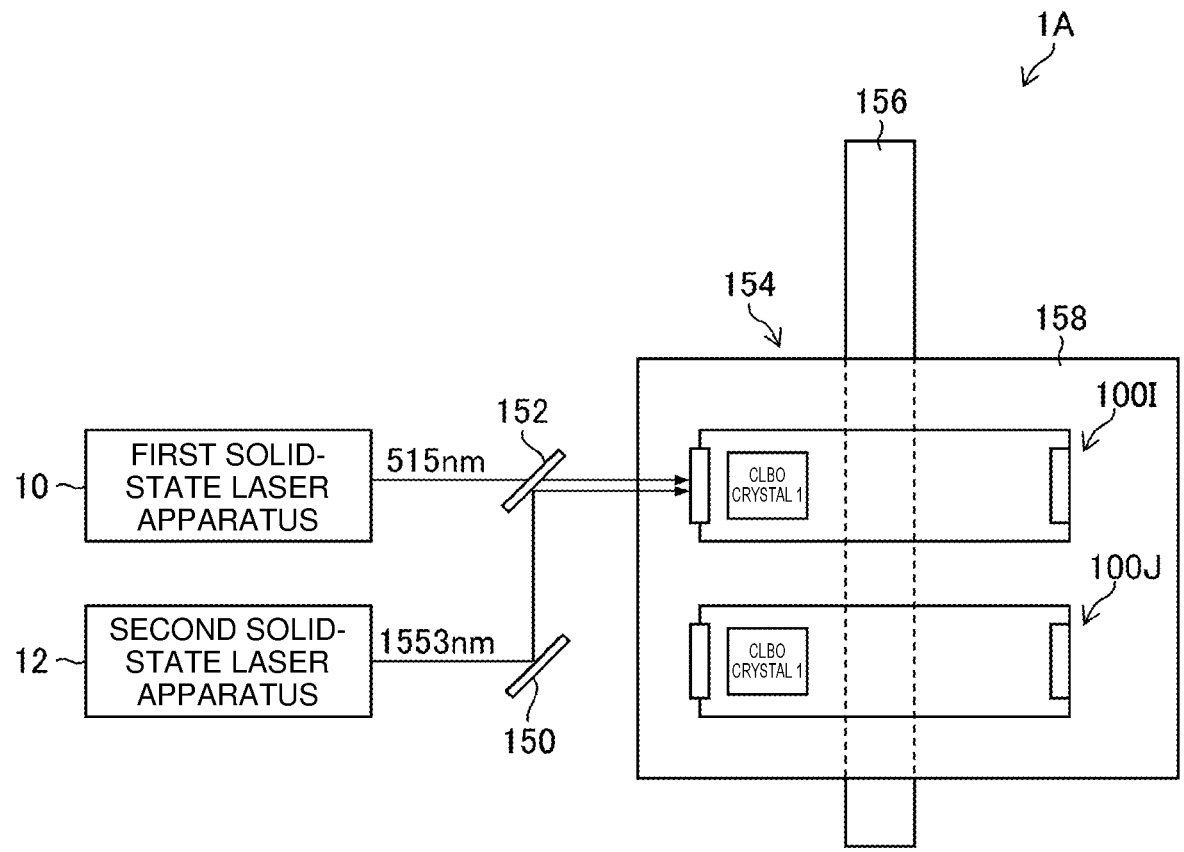
FIG. 15 is a diagram schematically illustrating the configuration of a solid-state laser system according to Embodiment 7.

FIG. 15 is a diagram schematically illustrating the configuration of a solid-state laser system 1A according to Embodiment 7. In FIG. 15, an X direction is defined to be the right direction, a Y direction is defined to be the upward direction, which is orthogonal to the X direction, and a Z direction is defined to be a direction orthogonal to the X direction and the Y direction.

As illustrated in FIG. 15, the solid-state laser system 1A includes a fourth high reflective mirror 150, a fourth dichroic mirror 152, and a stage 154 in addition to the first solid-state laser apparatus 10 and the second solid-state laser apparatus 12.

In Embodiment 7, the first solid-state laser apparatus 10 emits a pulse laser beam having a wavelength of 515 nm. The fourth high reflective mirror 150 is disposed so that a pulse laser beam emitted from the second solid-state laser apparatus 12 and having a wavelength of 1553 nm is input to the fourth dichroic mirror 152. The fourth dichroic mirror 152 is coated with a film that highly transmits the pulse laser beam emitted from the first solid-state laser apparatus 10 and having a wavelength of 515 nm and highly reflects the pulse laser beam having a wavelength of 1553 nm.

The stage 154 includes a rail 156 extending in the Y direction, and a placement table 158 movably held to the rail 156 along the rail 156 in the Y direction. A fourth drive cell 100I and a fourth backup cell 100J as CLBO crystal cells are disposed on the placement table 158 in the Y direction. The fourth drive cell 100I is an example of a "first wavelength conversion apparatus" in the present disclosure. The fourth backup cell 100J is an example of a "second wavelength conversion apparatus" in the present disclosure. The fourth drive cell 100I and the fourth backup cell 100J may be each, for example, the fourth CLBO crystal cell 100E.

In FIG. 15, the fourth drive cell 100I is disposed on the optical paths of the laser beams, and the fourth backup cell 100J is disposed out of the optical paths of the laser beams. FIG. 16 is a diagram illustrating a state in which the placement table 158 is moved from the state illustrated in FIG. 15. In the example illustrated in FIG. 16, the fourth drive cell 100I is disposed out of the optical paths of the laser beams, and the fourth backup cell 100J is disposed on the optical paths of the laser beams. In this manner, the stage 154 translates the fourth drive cell 100I and the fourth backup cell 100J with respect to the optical axis of the laser beams and disposes one of the cells on the optical paths of the laser beams.

10.2 Operation

Operation of the solid-state laser system 1A will be described below.

The fourth high reflective mirror 150 highly reflects the pulse laser beam having a wavelength of 1553 nm and emitted from the second solid-state laser apparatus 12 so that the pulse laser beam is incident on the fourth dichroic mirror 152.

The fourth dichroic mirror 152 highly transmits the pulse laser beam having a wavelength of 515 nm and emitted from the first solid-state laser apparatus 10 and highly reflects the pulse laser beam having a wavelength of 1553 nm and incident from the fourth high reflective mirror 150 so that the pulse laser beams are incident on the fourth drive cell 100I while the optical axes of the pulse laser beams are aligned with each other.

The wavelength of each pulse laser beam is converted as the pulse laser beam is incident through a non-illustrated entrance window of the fourth drive cell 100I and is incident on a CLBO crystal inside the fourth drive cell 100I, and a pulse laser beam having the converted wavelength is output through a non-illustrated exit window.

When the fourth drive cell 100I is to be replaced with the fourth backup cell 100J, the stage 154 moves the fourth drive cell 100I and the fourth backup cell 100J so that the state illustrated in FIG. 15 changes to the state illustrated in FIG. 16. Accordingly, the fourth drive cell 100I is retracted from the optical paths of the laser beams, and the fourth backup cell 100J is disposed on the optical paths of the laser beams.

Similarly to the fourth drive cell 100I having been disposed on the optical path, the fourth backup cell 100J disposed on the optical paths of the laser beams converts the wavelength of each laser beam.

10.3 Effect

With the solid-state laser system 1A according to Embodiment 7, optical axis positioning of the fourth backup cell 100J is unnecessary at replacement of the fourth drive cell 100I with the fourth backup cell 100J, and thus the maintenance time can be shortened.

11. Embodiment 8

11.1 Configuration

Figure 17:
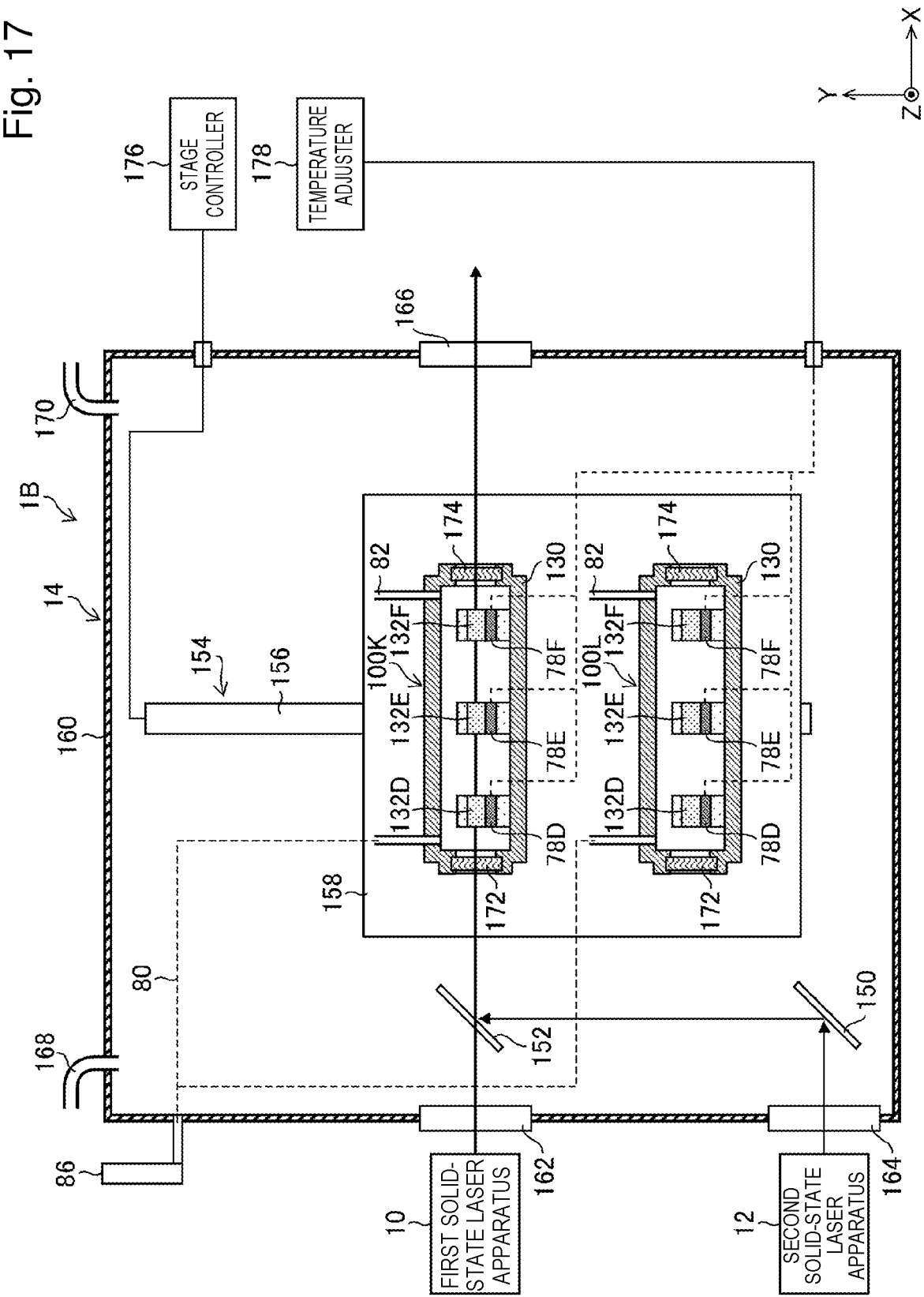
FIG. 17 is a diagram schematically illustrating the configuration of a solid-state laser system according to Embodiment 8.

FIG. 17 is a diagram schematically illustrating the configuration of a solid-state laser system 1B according to Embodiment 8. Difference from the solid-state laser system 1A illustrated in FIG. 15 will be described below.

As illustrated in FIG. 17, the solid-state laser system 1B includes a wavelength conversion box 160, a stage controller 176, and a temperature adjuster 178. The wavelength conversion box 160 includes a first window 162, a second window 164, a third window 166, a purge gas entrance pipe 168, and a purge gas exit pipe 170.

The first window 162 is disposed at a position where a pulse laser beam emitted from the first solid-state laser apparatus 10 is incident. The second window 164 is disposed at a position where a pulse laser beam emitted from the second solid-state laser apparatus 12 is incident. The third window 166 is disposed at a position facing the first window 162.

The wavelength conversion box 160 is sealed so that purge with $N_2$ gas is possible. The purge gas entrance pipe 168 provides communication between a non-illustrated $N_2$ gas supply apparatus and the inside of the wavelength conversion box 160. The purge gas exit pipe 170 provides communication between the inside of the wavelength conversion box 160 and a non-illustrated $N_2$ gas discharge apparatus.

The fourth high reflective mirror 150, the fourth dichroic mirror 152, and the stage 154 are disposed inside the wavelength conversion box 160. The fourth high reflective mirror 150 and the fourth dichroic mirror 152 are disposed so that the optical paths of a pulse laser beam having a wavelength of 1553 nm and a pulse laser beam having a wavelength of 515 nm are aligned with each other upstream of a fifth drive cell 100K.

The fifth drive cell 100K and a fifth backup cell 100L are disposed on the placement table 158 of the stage 154 in the Y direction.

The fifth drive cell 100K includes a plurality of CLBO crystals disposed in series. In this example, the fifth drive cell 100K includes an eighth CLBO crystal 132D, a ninth CLBO crystal 132E, and a tenth CLBO crystal 132F inside the second container 130. The second container 130 has a second entrance window 172 and a second exit window 174. The second entrance window 172, the eighth CLBO crystal 132D, the ninth CLBO crystal 132E, the tenth CLBO crystal 132F, and the second exit window 174 are disposed in series.

In addition, the fifth drive cell 100K includes a fifth heater 78D, a sixth heater 78E, and a seventh heater 78F inside the second container 130.

The fifth heater 78D is disposed at a position for heating the eighth CLBO crystal 132D. The sixth heater 78E is disposed at a position for heating the ninth CLBO crystal 132E. The seventh heater 78F is disposed at a position for heating the tenth CLBO crystal 132F. The fifth drive cell 100K also includes a non-illustrated temperature sensor configured to measure the temperature of each of the eighth CLBO crystal 132D, the ninth CLBO crystal 132E, and the tenth CLBO crystal 132F.

The temperature adjuster 178 is connected to the fifth heater 78D, the sixth heater 78E, the seventh heater 78F, and the non-illustrated temperature sensor. The temperature control unit 106 (refer to FIG. 7) may be provided in place of the temperature adjuster 178.

In addition, the fifth drive cell 100K includes a non-illustrated battery. The configuration of the fifth backup cell 100L is same as that of the fifth drive cell 100K.

The stage controller 176 controls the stage 154. In this example, the stage 154 includes a non-illustrated actuator, and the stage controller 176 controls movement of the placement table 158 by controlling the non-illustrated actuator.

11.2 Operation

Operation of the solid-state laser system 1B will be described below.

The temperatures of the eighth CLBO crystal 132D, the ninth CLBO crystal 132E, and the tenth CLBO crystal 132F of the fifth drive cell 100K and the temperatures of the eighth CLBO crystal 132D, the ninth CLBO crystal 132E, and the tenth CLBO crystal 132F of the fifth backup cell 100L are each increased to 120° C. at predetermined steps and held for a predetermined time based on the amount of gas flow.

In this state, the fifth drive cell 100K performs wavelength conversion. Specifically, the solid-state laser system 1B controls the stage 154 through the stage controller 176 so that the fifth drive cell 100K is disposed on the optical paths of the laser beams as illustrated in FIG. 17. Then, the pulse laser beams are incident on the second entrance window 172 of the fifth drive cell 100K from the fourth dichroic mirror 152. As a result, a pulse laser beam having a wavelength converted through the eighth CLBO crystal 132D, the ninth CLBO crystal 132E, and the tenth CLBO crystal 132F is output through the second exit window 174 and then output through the third window 166 of the wavelength conversion box 160.

During this process as well, the fifth backup cell 100L is prepared. Specifically, the fifth backup cell 100L is continuously held at a predetermined temperature based on the amount of gas flow.

Figure 18:
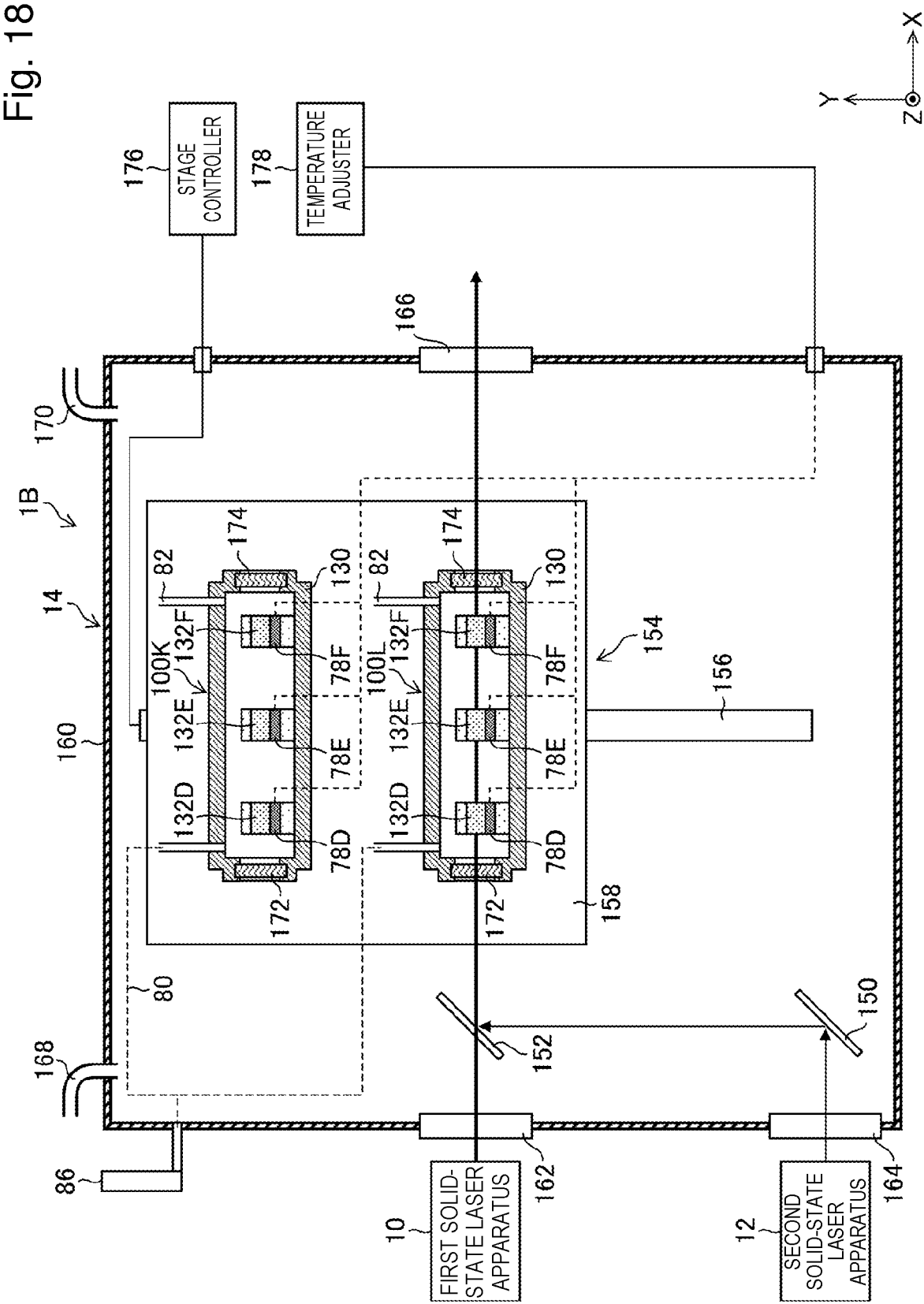
FIG. 18 is a diagram illustrating a state in which the placement table is moved from a state illustrated in FIG. 17.

FIG. 18 is a diagram illustrating a state in which the placement table 158 is moved from the state illustrated in FIG. 17. The fifth backup cell 100L performs wavelength conversion when any of the eighth CLBO crystal 132D, the ninth CLBO crystal 132E, and the tenth CLBO crystal 132F of the fifth drive cell 100K has reached its lifetime. Specifically, the solid-state laser system 1B controls the stage 154 through the stage controller 176 so that the fifth backup cell 100L is disposed on the optical paths of the laser beams as illustrated in FIG. 18. Then, the pulse laser beams are incident on the second entrance window 172 of the fifth drive cell 100K through the fourth dichroic mirror 152. As a result, a pulse laser beam having a wavelength converted through the eighth CLBO crystal 132D, the ninth CLBO crystal 132E, and the tenth CLBO crystal 132F is output through the second exit window 174 and then output through the third window 166 of the wavelength conversion box 160.

11.3 Effect

With the solid-state laser system 1B according to Embodiment 8, it is possible to obtain effects same as those of Embodiment 1. Moreover, since the optical paths are connected right before the eighth CLBO crystal 132D, three CLBO crystals for wavelength conversion (drive cell) and three CLBO crystals for backup (backup cell) can be disposed in series, which leads to apparatus downsizing.

In addition, since a plurality of CLBO crystals are disposed in one CLBO crystal cell, the number of stages and pipes can be reduced, which also leads to apparatus downsizing. Furthermore, when a CLBO crystal cell used for wavelength conversion is to be replaced, a plurality of CLBO crystals can be replaced by replacing one CLBO crystal cell, and thus a time taken for maintenance can be shortened.

12. Embodiment 9

12.1 Configuration

Figure 19:
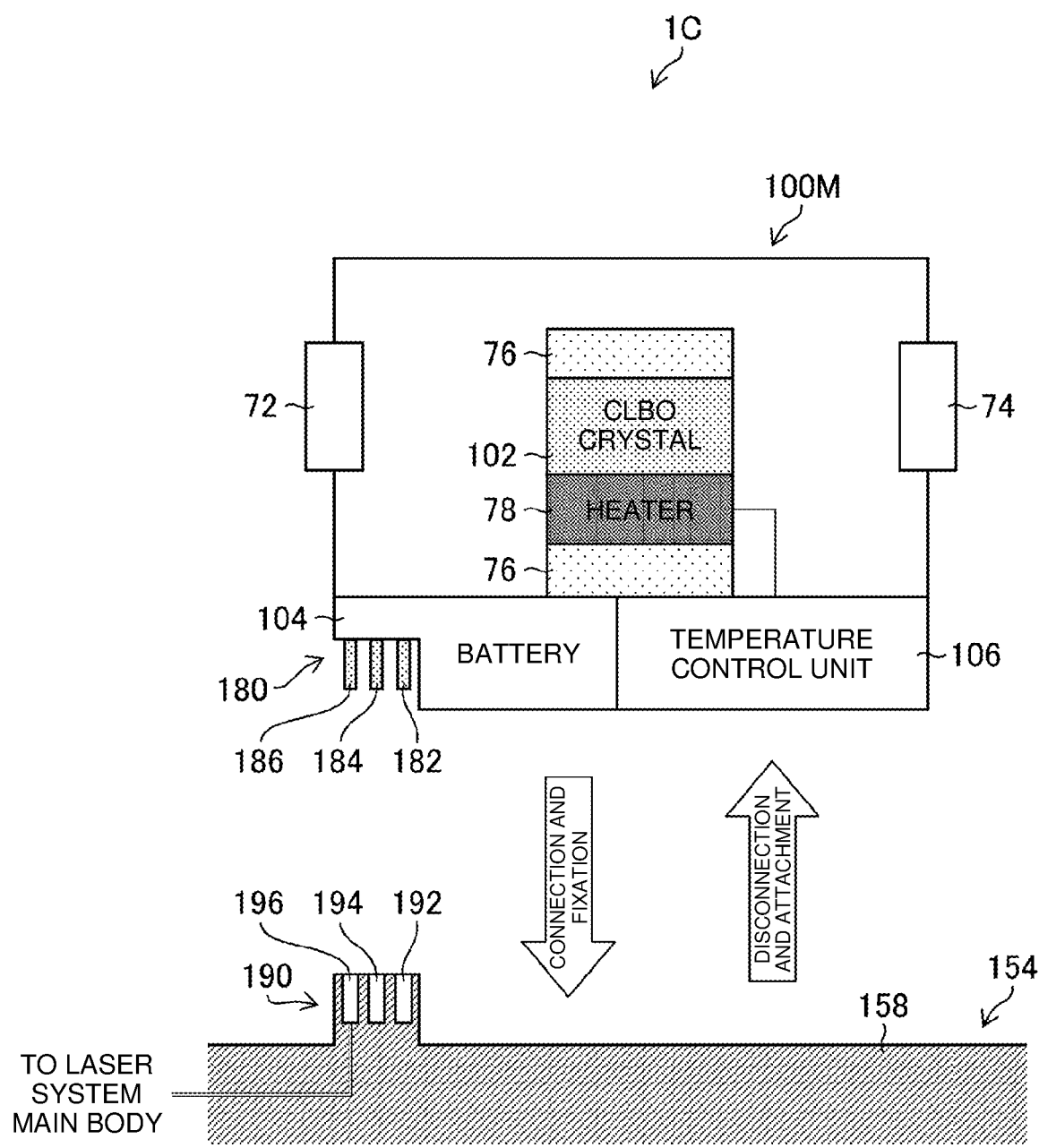
FIG. 19 is a diagram schematically illustrating the configuration of a solid-state laser system according to Embodiment 9.

FIG. 19 is a diagram schematically illustrating the configuration of a solid-state laser system 1C according to Embodiment 9. The solid-state laser system 1C includes a sixth CLBO crystal cell 100M. The sixth CLBO crystal cell 100M may be a drive cell or a backup cell.

A cartridge connection portion 180 is provided to the sixth CLBO crystal cell 100M. The cartridge connection portion 180 includes first power source terminals 182 and 184 and a first gas line 186. The first power source terminals 182 and 184 may be connected to, for example, the positive and negative electrodes of the battery 104, respectively. The first gas line 186 may be, for example, the Ar gas supply pipe 80.

In addition, the solid-state laser system 1C includes, on the placement table 158 of the stage 154, a positioning connection portion 190 as a wiring-connection mechanism of electricity and gas supplied and connected from the solid-state laser system 1C. The positioning connection portion 190 includes second power source terminals 192 and 194 and a second gas line 196. The second power source terminals 192 and 194 may be connected to, for example, the positive and negative electrodes of the external power source 108, respectively. The second gas line 196 may communicate with, for example, the Ar gas supply apparatus 86 (refer to FIG. 2).

The cartridge connection portion 180 and the positioning connection portion 190 have a function to position and fix the sixth CLBO crystal cell 100M to the placement table 158 when the connection portions are engaged with each other.

12.2 Operation

Operation of the solid-state laser system 1C will be described below.

The user fixes the sixth CLBO crystal cell 100M to the placement table 158 through the cartridge connection portion 180 and the positioning connection portion 190. When the sixth CLBO crystal cell 100M is fixed to the placement table 158, the first power source terminals 182 and 184 are connected to the second power source terminals 192 and 194. Accordingly, electric power can be supplied to the sixth CLBO crystal cell 100M. When the sixth CLBO crystal cell 100M is fixed to the placement table 158, the first gas line 186 is connected to the second gas line 196. Accordingly, Ar gas can be supplied to the sixth CLBO crystal cell 100M. In this manner, when a drive cell or a backup cell is fixed, electricity and gas lines are connected to the drive cell or the backup cell simultaneously with the fixation.

12.3 Effect

With the solid-state laser system 1C according to Embodiment 9, work of fixing and positioning the placement table 158 and a drive cell or a backup cell is simplified, and electricity and gas lines are connected together with the fixation, which can shorten the maintenance time.

13. Electronic Device Manufacturing Method

Figure 20:
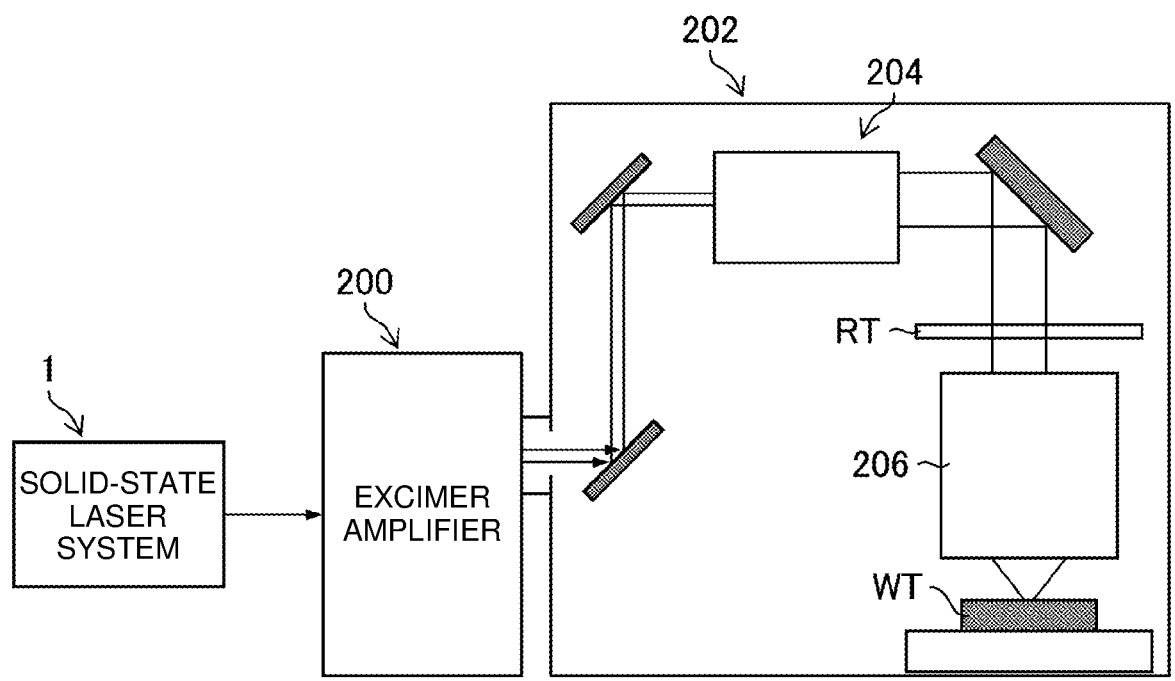
FIG. 20 is a diagram schematically illustrating the configuration of an exposure apparatus.

FIG. 20 is a diagram schematically illustrating the configuration of an exposure apparatus 202. An electronic device manufacturing method is achieved by the solid-state laser system 1, an excimer amplifier 200, and the exposure apparatus 202.

The excimer amplifier 200 is, for example, an ArF excimer laser apparatus configured to amplify a laser beam. The solid-state laser system 1 and the excimer amplifier 200 constitute a hybrid laser apparatus. The excimer amplifier 200 amplifies a pulse laser beam emitted from the solid-state laser system 1. The pulse laser beam amplified by the excimer amplifier 200 is input to the exposure apparatus 202 and used as exposure light.

The exposure apparatus 202 includes an illumination optical system 204 and a projection optical system 206. The illumination optical system 204 illuminates a reticle pattern on a reticle stage RT with an excimer laser beam incident from the excimer amplifier 200. The projection optical system 206 images, by reduced projection, the laser beam having transmitted through a reticle onto a non-illustrated workpiece disposed on a workpiece table WT. The workpiece is a photosensitive substrate such as a semiconductor wafer to which photoresist is applied. The exposure apparatus 202 translates the reticle stage RT and the workpiece table WT in synchronization with each other so that the workpiece is exposed to the laser beam reflected by the reticle pattern. A semiconductor device can be manufactured by transferring a device pattern onto a semiconductor wafer through an exposure process as described above. The semiconductor device is an example of an "electronic device" in the present disclosure. The solid-state laser system 1 may be each of the solid-state laser systems 1A, 1B, and 1C described in the embodiments.

14. Other

The description above is intended to be merely an example, not a limitation. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms unless otherwise stated. For example, terms such as "include" or "included" should not be interpreted "not limited to what is described as being included." The term "have" should be construed as "not limited to what is described as having." Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. A wavelength conversion apparatus that performs wavelength conversion of light through a non-linear crystal, the wavelength conversion apparatus comprising:

a first non-linear crystal;
a container in which the first non-linear crystal is housed;
a crystal holding member provided inside the container and configured to fix the first non-linear crystal;
a first window provided to the container and configured to guide light from outside of the container to the first non-linear crystal;
a second window provided to the container and configured to guide light output from the first non-linear crystal to outside of the container;
a first heater provided inside the container and configured to heat the first non-linear crystal;
a battery configured to supply electric power to the first heater; and
a first controller configured to control electric power supply to the first heater, wherein
the first controller changes an electric power supply amount in accordance with an electrical storage amount of the battery.

2. The wavelength conversion apparatus according to claim 1, wherein the first controller selects whether to use the battery or an external power source for supplying electric power.

3. The wavelength conversion apparatus according to claim 2, wherein the battery is charged by the external power source.

4. The wavelength conversion apparatus according to claim 2, wherein the first controller uses the external power source for supplying electric power to the first heater.

5. The wavelength conversion apparatus according to claim 2, wherein the first controller starts heating of the first non-linear crystal based on a signal from outside of the wavelength conversion apparatus.

6. The wavelength conversion apparatus according to claim 2, wherein the first controller continues the electric power supply to the first heater at switching from the battery to the external power source and switching from the external power source to the battery.

7. The wavelength conversion apparatus according to claim 1, further comprising:
a second non-linear crystal that is provided between the first non-linear crystal and the second window and to which the light output from the first non-linear crystal is input; and
a second heater configured to heat the second non-linear crystal.

8. The wavelength conversion apparatus according to claim 7, further comprising a second controller configured to control electric power supply to the second heater, wherein the second controller selects whether to use the battery or an external power source for supplying electric power.

9. The wavelength conversion apparatus according to claim 1, further comprising:
a supply pipe through which gas is supplied inside the container;
a discharge pipe through which the gas is discharged to outside of the container;
a supply valve provided to the supply pipe and configured to automatically open when the gas is to be supplied and to automatically close when supply of the gas is to be stopped; and
a discharge valve provided to the discharge pipe and configured to automatically open when the gas is to be discharged and to automatically close when discharge of the gas is to be stopped.

10. The wavelength conversion apparatus according to claim 9, wherein the gas is inert gas.

11. The wavelength conversion apparatus according to claim 1, wherein the first controller outputs an alert signal when the electrical storage amount of the battery becomes smaller than a first threshold value.

12. The wavelength conversion apparatus according to claim 1, wherein the first non-linear crystal is any of a BBO crystal, an LBO crystal, and a CLBO crystal.

13. A wavelength conversion apparatus that performs wavelength conversion of light through a non-linear crystal, the wavelength conversion apparatus comprising:
a first non-linear crystal;
a container in which the first non-linear crystal is housed;
a crystal holding member provided inside the container and configured to fix the first non-linear crystal;
a first window provided to the container and configured to guide light from outside of the container to the first non-linear crystal;
a second window provided to the container and configured to guide light output from the first non-linear crystal to outside of the container;
a first heater provided inside the container and configured to heat the first non-linear crystal;
a battery configured to supply electric power to the first heater; and
a first controller configured to control electric power supply to the first heater, wherein
the first controller controls electric power supply to the first heater so that temperature of the first non-linear crystal gradually decreases when the battery is to be replaced.

14. The wavelength conversion apparatus according to claim 13, wherein the first controller selects whether to use the battery or an external power source for supplying electric power.

15. The wavelength conversion apparatus according to claim 14, wherein the battery is charged by the external power source.

16. The wavelength conversion apparatus according to claim 14, wherein the first controller uses the external power source for supplying electric power to the first heater.

17. The wavelength conversion apparatus according to claim 14, wherein the first controller starts heating of the first non-linear crystal based on a signal from outside of the wavelength conversion apparatus.

18. The wavelength conversion apparatus according to claim 14, wherein the first controller continues the electric power supply to the first heater at switching from the battery to the external power source and switching from the external power source to the battery.

19. The wavelength conversion apparatus according to claim 13, further comprising:
a second non-linear crystal that is provided between the first non-linear crystal and the second window and to which the light output from the first non-linear crystal is input; and
a second heater configured to heat the second non-linear crystal.

20. The wavelength conversion apparatus according to claim 19, further comprising a second controller configured to control electric power supply to the second heater, wherein the second controller selects whether to use the battery or an external power source for supplying electric power.

21. The wavelength conversion apparatus according to claim 13, further comprising:
a supply pipe through which gas is supplied inside the container;

a discharge pipe through which the gas is discharged to outside of the container;

a supply valve provided to the supply pipe and configured to automatically open when the gas is to be supplied and to automatically close when supply of the gas is to be stopped; and a discharge valve provided to the discharge pipe and configured to automatically open when the gas is to be discharged and to automatically close when discharge of the gas is to be stopped.

22. The wavelength conversion apparatus according to claim 21, wherein the gas is inert gas.

23. The wavelength conversion apparatus according to claim 13, wherein the first non-linear crystal is any of a BBO crystal, an LBO crystal, and a CLBO crystal.

24. A solid-state laser system comprising:

a solid-state laser apparatus configured to emit light;

a first wavelength conversion apparatus configured to perform wavelength conversion of the light through a non-linear crystal, the first wavelength conversion apparatus including
  a first non-linear crystal,
  a container in which the first non-linear crystal is housed,
  a crystal holding member provided inside the container and configured to fix the first non-linear crystal,
  a first window provided to the container and configured to guide light from outside of the container to the first non-linear crystal,
  a second window provided to the container and configured to guide light output from the first non-linear crystal to outside of the container,
  a first heater provided inside the container and configured to heat the first non-linear crystal,
  a battery configured to supply electric power to the first heater, and
  a first controller configured to control electric power supply to the first heater;

a second wavelength conversion apparatus that is different from the first wavelength conversion apparatus;

a stage configured to translate, with respect to an optical axis of the light, a placement table to which the first wavelength conversion apparatus and the second wavelength conversion apparatus are fixed;

a cartridge connection portion provided to the first wavelength conversion apparatus;

a positioning connection portion provided to the placement table;

a first power source terminal provided to the cartridge connection portion; and a second power source terminal provided to the positioning connection portion, wherein the first wavelength conversion apparatus is fixed to the placement table when the cartridge connection portion and the positioning connection portion are engaged with each other, and the first power source terminal and the second power source terminal are connected to each other when the cartridge connection portion and the positioning connection portion are engaged with each other.

25. The solid-state laser system according to claim 24, further comprising:

a first gas line provided to the cartridge connection portion; and a second gas line provided to the positioning connection portion, wherein the first gas line and the second gas line are connected to each other when the cartridge connection portion and the positioning connection portion are engaged with each other.

* * * * *